US008399159B2

United States Patent
Sasaki et al.

(10) Patent No.: US 8,399,159 B2
(45) Date of Patent: Mar. 19, 2013

(54) MASK BLANK SUBSTRATE

(75) Inventors: Tatsuya Sasaki, Tokyo (JP); Takahiro Miyazaki, Tokyo (JP)

(73) Assignee: Hoya Corporation, Tokyo (JP)

( * ) Notice: Subject to any disclaimer, the term of this patent is extended or adjusted under 35 U.S.C. 154(b) by 152 days.

(21) Appl. No.: 13/120,263

(22) PCT Filed: Nov. 25, 2009

(86) PCT No.: PCT/JP2009/069818
§ 371 (c)(1),
(2), (4) Date: Mar. 22, 2011

(87) PCT Pub. No.: WO2010/061828
PCT Pub. Date: Jun. 3, 2010

(65) Prior Publication Data
US 2011/0171568 A1    Jul. 14, 2011

(30) Foreign Application Priority Data

Nov. 26, 2008   (JP) ................................ 2008-301238

(51) Int. Cl.
*G03F 1/24* (2012.01)
*G03F 7/00* (2006.01)
(52) U.S. Cl. .......................................... 430/5; 430/311
(58) Field of Classification Search ................ 430/5, 30, 430/311, 312, 322
See application file for complete search history.

(56) References Cited

U.S. PATENT DOCUMENTS

| 2003/0186624 A1 | 10/2003 | Koike et al. |
| 2005/0020083 A1 | 1/2005 | Numanami et al. |
| 2006/0194126 A1* | 8/2006 | Tanabe ............................ 430/5 |
| 2006/0226124 A1 | 10/2006 | Nakamura et al. |
| 2009/0017257 A1 | 1/2009 | Otsuka et al. |

FOREIGN PATENT DOCUMENTS

| JP | 2003-50458 A | 2/2003 |
| JP | 2004-29736 A | 1/2004 |

(Continued)

OTHER PUBLICATIONS

Korean Office Action corresponding to Korean Patent Application No. 10-2011-7003768, dated Oct. 24,2012.

*Primary Examiner* — Stephen Rosasco
(74) *Attorney, Agent, or Firm* — Sughrue Mion, PLLC

(57) ABSTRACT

Provided is a mask blank substrate that can reduce the change in flatness of a main surface thereof before and after chucking to make very small the position offset caused by a photomask and that can significantly reduce the difference in tendency of substrate deformation before and after chucking between photomasks. In a mask blank substrate having two main surfaces and four end faces, a central point is set on the main surface, a first axis of symmetry that passes through the central point and that is parallel to one of the end faces and a second axis of symmetry that passes through the central point and that is perpendicular to the first axis of symmetry are respectively set, measurement points are set in the form of a grid with respect to the first axis of symmetry and the second axis of symmetry so as to measure heights of the main surface from a reference plane at the measurement points, respectively, differences each between measured height values at those measurement points located at positions that are axisymmetric with respect to the first axis of symmetry are calculated, and those differences corresponding to at least 95% of the total number of the calculated differences between the measured height values are within a predetermined value.

33 Claims, 7 Drawing Sheets

FOREIGN PATENT DOCUMENTS

| | | |
|---|---|---|
| JP | 2004-157574 A | 6/2004 |
| JP | 2005-43838 A | 2/2005 |
| JP | 2006-11434 A | 1/2006 |
| JP | 2007-287737 A | 11/2007 |
| KR | 10-20060107319 A | 10/2006 |

\* cited by examiner (a)

(b)

MASK BLANK SUBSTRATE

CROSS REFERENCE TO RELATED APPLICATION

This application is a National Stage of International Application No. PCT/JP2009/069818 filed Nov. 25, 2009, claiming priority based on Japanese Patent Application No. 2008-301238, filed Nov. 26, 2008, the contents of all of which are incorporated herein by reference in their entirety.

TECHNICAL FIELD

This invention relates to a mask blank substrate for a photomask adapted to be used in a photolithography process.

BACKGROUND ART

In a photolithography process of semiconductor manufacturing processes, a photomask is used. With the miniaturization of semiconductor devices, a demand for miniaturization in this photolithography process has been increasing. Particularly, an increase in NA of an exposure apparatus using ArF exposure light (193 nm) has proceeded for adaptation to the miniaturization and a further increase in NA is proceeding following the introduction of the immersion exposure technique. For adaptation to the demand for the miniaturization and the increase in NA described above, it is required to enhance the flatness of a photomask. That is, in view of the fact that the allowable amount of position offset of a transfer pattern due to the flatness has been reduced with the reduction in pattern line width and that the focus latitude in the lithography process has been reduced with the increase in NA, the flatness of main surfaces of a mask substrate, particularly the main surface on the side where a pattern is to be formed (hereinafter, the main surface on this side will be referred to simply as a main surface or a substrate main surface), is becoming more important.

On the other hand, when the photomask is chucked on a mask stage of an exposure apparatus by a vacuum chuck, it may happen that the photomask is largely deformed upon chucking due to the affinity with the mask stage or the vacuum chuck. That is, conventionally, since the product management is conducted in terms of the flatness of the photomask before chucking, it may happen that even if the photomask is excellent before chucking, when the photomask is chucked on the mask stage of the exposure apparatus, the flatness thereof is largely degraded depending on the affinity with the mask stage or the vacuum chuck. This tendency is outstanding particularly in the case of a substrate that tends to be distorted due to relatively low symmetry of the shape of its main surface. Thus, it is becoming necessary to consider the flatness of the photomask when it is chucked by the vacuum chuck. There has conventionally been proposed a method of selecting a mask substrate having excellent flatness after chucking on a mask stage of an exposure apparatus (see, e.g. Patent Document 1). It is described that, in this method, it is possible to select a mask substrate having a surface shape with excellent flatness both before and after chucking on a mask stage of an exposure apparatus by measuring the surface shape and the flatness of a main surface of each of a plurality of mask substrates and then simulating a change in flatness when the substrate is chucked on the mask stage.

PRIOR ART DOCUMENT

Patent Document
  Patent Document 1: JP-A-2003-50458

SUMMARY OF THE INVENTION

Problem to be Solved by the Invention

According to the conventional method, however, for each of a plurality of mask substrates (mask blank substrates), it is necessary to obtain information indicating the surface shape of a main surface thereof and flatness information of the main surface before and after chucking on a mask stage of an exposure apparatus or to obtain, based on the flatness of a main surface thereof and the structure of a mask chuck of an exposure apparatus, information indicating the flatness of the main surface by simulation when the mask substrate is set in the exposure apparatus. Therefore, conventionally, it takes much time and labor to select a mask substrate having excellent flatness after chucking on the mask stage of the exposure apparatus. Further, the structure for chucking a mask substrate on a mask stage differs depending on an exposure apparatus and thus it is necessary to select a mask substrate per exposure apparatus.

Conventionally, use is made of a technique that aims at finishing substrate main surfaces to have higher flatness in a substrate polishing process, selects substrates polished to high flatness from among polished substrates, and further extracts those substrates by simulation that match an exposure apparatus to be used. However, when the substrates are polished so as to have high flatness by the use of a double-side polishing machine adapted to simultaneously polish a plurality of substrates, the number of substrates reaching a target flatness is small among the simultaneously polished substrates and thus the yield of substrate production is low, which has been a problem. Further, as described above, the substrate polished to high flatness is not necessarily fit for the exposure apparatus to be used and thus the yield of substrate production is significantly reduced, which has been a problem.

In semiconductor manufacturing processes, when forming a laminated structure having a circuit pattern of a semiconductor device, a photolithography process is carried out for each of layers. In the circuit pattern, it is necessary to form wiring also between the upper and lower layers. Therefore, the overlay accuracy of patterns of the respective layers is important. Particularly, with the pattern miniaturization and the increase in pattern density in recent years, high overlay accuracy is required for a set of photomasks that are used in forming a laminated structure of a semiconductor device. That is, there is required, on a wafer, an overlay accuracy of 1.3 nm or less in the flash memory hp (half-pitch) 36 nm generation or of 0.9 nm or less in the flash memory hp25 nm generation. However, with respect to the set of photomasks, even if a pattern can be formed with high position accuracy in each photomask, if deformation tendencies of substrates thereof when the photomasks are vacuum-chucked in an exposure apparatus differ from each other, position offsets of the patterns on the substrates also show different tendencies so that the overlay accuracy is degraded.

On the other hand, in recent years, the pattern miniaturization and the increase in pattern density have advanced significantly so that the formation of a fine, high-density pattern in a single mask has been subjected to a limit. As one of means for solving this lithography technique problem, the double patterning/double exposure (DP/DE) techniques have been developed. The double patterning/double exposure techniques are the same until a single fine, high-density pattern is divided into two relatively coarse patterns (a first pattern and a second pattern) to thereby produce photomasks (a first photomask and a second photomask) formed with the two patterns, respectively.

In the case of the double patterning technique, first, an exposure process for transferring a first pattern onto a first resist film coated on an outermost layer of a semiconductor device is carried out using a first photomask and then a development process is carried out, thereby transferring the first pattern to the first resist film (formation of a first resist pattern). Then, the outermost layer is dry-etched using the first resist film pattern as an etching mask, thereby transferring the first pattern to the outermost layer. Then, the first resist pattern is stripped and a second resist film is coated on the outermost layer. Then, an exposure process for transferring a second pattern onto the second resist film is carried out using a second photomask and then a development process is carried out, thereby transferring the second pattern to the second resist film (formation of a second resist pattern). Then, the outermost layer is dry-etched using the second resist film pattern as an etching mask, thereby transferring the second pattern to the outermost layer. By carrying out these processes, a fine, high-density pattern in combination of the first pattern and the second pattern can be transferred to the outermost layer of the semiconductor device.

On the other hand, in the case of the double exposure technique, with respect to a resist film coated on an outermost layer of a semiconductor device, an exposure process for transferring a first pattern is carried out using a first photomask and then an exposure process for transferring a second pattern is carried out using a second photomask. Thus, the exposure is carried out twice with respect to the same resist film. Then, by applying a development process to the resist film after these processes, a fine, high-density pattern in combination of the first pattern and the second pattern can be transferred to the resist film. Then, the fine, high-density pattern is transferred to the outermost layer of the semiconductor device according to the usual process.

In either of the double patterning/double exposure (DP/DE) techniques, the overlay accuracy of the first pattern and the second pattern exposed and transferred using the set of the two photomasks largely affects the semiconductor device pattern transfer accuracy (if the overlay accuracy is low, serious problems occur for the semiconductor device such as a large change in width of a conductor formed in the semiconductor device and the occurrence of a disconnection or short.). With respect to this set of photomasks, even if the pattern can be formed with very high position accuracy in each photomask, if deformation tendencies of substrates thereof when the photomasks are vacuum-chucked in an exposure apparatus differ from each other, position offsets of the patterns on the substrates also show different tendencies so that the overlay accuracy is largely degraded.

In general, a pellicle with a structure in which a resin film adapted to transmit exposure light is stretched on one side of a frame is attached to an upper surface of a thin film, formed with a transfer pattern, of a photomask. This is necessary for preventing particles from adhering to the surface of the transfer pattern of the photomask. However, even when the pellicle is attached to the thin film formed with the transfer pattern, a deformation force is applied to a substrate. In this event, if deformation tendencies of substrates differ from each other in respective photomasks, position offsets of patterns on the substrates also show different tendencies so that the overlay accuracy is largely degraded.

This invention has been made in view of these circumstances and has an object to provide a mask blank substrate, a mask blank, a reflective mask blank, a photomask, a reflective mask, a mask blank substrate set, a mask blank set, and a photomask set, which can reduce the change in flatness of a main surface before and after chucking to make very small the position offset caused by a photomask and can significantly reduce the difference in tendency of substrate deformation before and after chucking between photomasks, and to provide a method of manufacturing a semiconductor device using the same.

Means for Solving the Problem

A mask blank substrate of this invention is characterized in that (1) a first axis of symmetry that passes through a central point set on a main surface of a substrate having two main surfaces and four end faces and that is parallel to one of the end faces and a second axis of symmetry that passes through the central point and that is perpendicular to the first axis of symmetry are respectively set, and measurement points are set in the form of a grid with respect to the first axis of symmetry and the second axis of symmetry so as to measure heights of the main surface from a reference plane at the measurement points, respectively, and that (2) differences each between measured height values at those measurement points located at positions that are axisymmetric with respect to the first axis of symmetry are calculated, and those differences corresponding to at least 95% of the total number of the calculated differences between the measured height values are within a predetermined value.

In the mask blank substrate of this invention, it is preferable that differences each between the measured height values at those measurement points located at the positions that are axisymmetric with respect to the second axis of symmetry are calculated, and those differences corresponding to at least 95% of the number of the calculated differences between the measured height values are within the predetermined value.

A mask blank substrate of this invention is characterized in that (1) a first axis of symmetry that passes through a central point set on a main surface of a substrate having two main surfaces and four end faces and that is parallel to one of the end faces and a second axis of symmetry that passes through the central point and that is perpendicular to the first axis of symmetry are respectively set, and measurement points are set in the form of a grid with respect to the first axis of symmetry and the second axis of symmetry so as to measure heights of the main surface from a reference plane at the measurement points, respectively, and that (2) differences each between measured height values at those measurement points located at positions that overlap each other when all the measurement points are rotated by 90 degrees about the central point as a rotation axis to cause all the measurement points before rotation and all the measurement points after the rotation to overlap each other are calculated, and those differences corresponding to at least 95% of the total number of the calculated differences between the measured height values are within a predetermined value.

In the mask blank substrate of this invention, it is preferable that the measurement points are set on the main surface on a side where a thin film for transfer pattern formation is to be provided.

In the mask blank substrate of this invention, it is preferable that a flatness in a 132 mm square area of the main surface on the side where the thin film for transfer pattern formation is to be provided is 0.3 µm or less and that those differences corresponding to at least 95% of the total number of the calculated differences between the measured height values are within 10 nm.

In the mask blank substrate of this invention, it is preferable that a flatness in a 142 mm square area of the main surface on the side where the thin film for transfer pattern formation is to be provided is 0.3 μm or less and that those differences corresponding to at least 95% of the total number of the calculated differences between the measured height values are within 20 nm.

According to each of these structures, it is possible to realize the mask blank substrate with high symmetry. When the shape of the main surface has high symmetry, variation in deformation force applied to the substrate upon chucking in an exposure apparatus is small so that localized deformation does not tend to occur. Further, even when a pellicle is attached to an upper surface of a thin film, formed with a transfer pattern, of a photomask after the photomask is manufactured from such a mask blank substrate, variation in deformation force applied to the substrate is small so that localized deformation does not tend to occur. As a consequence, it is possible to make better the flatness of the main surface after chucking and thus to make very small the position offset caused by the photomask. Further, by defining the flatness in the 132 mm square area of the main surface to be 0.3 μm or less, the flatness before chucking in the exposure apparatus can be set to a high level. Thus, the flatness change amount before and after chucking in the exposure apparatus also becomes small so that it is possible to further suppress the position offset caused by the photomask. Further, if the flatness in the 142 mm square area of the main surface is defined to be 0.3 μm or less, which is a stricter condition, it is possible to obtain a higher-level mask blank substrate, which is thus preferable.

In the mask blank substrate of this invention, it is preferable that those differences corresponding to at least 95% of the total number of the differences between the measured height values calculated in chuck areas of the main surface are within 2 nm, the chuck areas serving as areas that are suction-chucked when mounted in an exposure apparatus.

According to this structure, it is possible to significantly improve the symmetry of the substrate main surface in the areas that are suction-chucked by the exposure apparatus. Therefore, the deformation force applied to the substrate upon suction chucking becomes more uniform and thus it is possible to manufacture a photomask with very high accuracy based on this mask blank substrate.

In the mask blank substrate of this invention, it is preferable that the measurement points are set on the main surface on a side opposite to a side where a thin film for transfer pattern formation is to be provided and that those differences corresponding to at least 95% of the total number of the calculated differences between the measured height values are within 5 nm.

According to this structure, it is most preferable to use this mask blank substrate particularly as a mask blank substrate for use in a reflective mask for EUV (Extreme Ultra Violet) exposure of which the substrate back side is chucked when it is set in an exposure apparatus. Since the substrate of this structure has high symmetry and high flatness on the back side, a substrate deformation force when the back side is chucked becomes more uniform so that it is possible to suppress the change in flatness of the main surface on the front side where a multilayer reflective film and an absorber pattern are formed. As a consequence, it is possible to largely suppress the position offset in the EUV exposure reflective mask.

Preferably, a mask blank of this invention has a structure in which a thin film for transfer pattern formation is formed on the main surface of the mask blank substrate.

A reflective mask blank of this invention is preferably configured such that, in the mask blank substrate in which the main surface shape is defined with respect to the main surface on the side opposite to the side where the thin film for transfer pattern formation is to be provided, a multilayer reflective film and a thin film for transfer pattern formation are formed on the main surface, on the side where the thin film for transfer pattern formation is to be provided, and a back-surface film is formed on the main surface on the opposite side.

A photomask of this invention preferably has a structure in which a transfer pattern is formed in the thin film for transfer pattern formation of the mask blank.

A reflective mask of this invention preferably has a structure in which a transfer pattern is formed in the thin film for transfer pattern formation of the reflective mask blank.

A mask blank substrate set of this invention preferably comprises a plurality of the mask blank substrates.

A mask blank set of this invention preferably comprises a plurality of the mask blanks.

The photomask set of this invention preferably comprises two photomasks, wherein two transfer patterns divided from a single transfer pattern by a double patterning/double exposure technique are separately formed in the thin films for transfer pattern formation of the two photomasks.

According to these structures, the substrates with high symmetry show the same substrate shape deformation tendency when chucked in the exposure apparatus. Position offsets of the photomasks also show the same tendency and further the flatness change amounts are also suppressed to be small. As a consequence, the position accuracy between the photomasks of the photomask set can be set to a very high level.

A method of manufacturing a semiconductor device of this invention preferably comprises a step of, using the photomask, exposing and transferring the transfer pattern of the photomask to a resist film on a wafer by a photolithography method.

A method of manufacturing a semiconductor device of this invention preferably comprises a step of, using the reflective mask, exposing and transferring the transfer pattern of the reflective mask to a resist film on a wafer by an EUV lithography method.

A method of manufacturing a semiconductor device of this invention preferably comprises a step of, using the photomask set, exposing and transferring the transfer patterns of the photomasks to a resist film on a wafer by a photolithography method.

EFFECT OF THE INVENTION

A mask blank substrate of this invention is such that (1) a first axis of symmetry that passes through a central point set on a main surface of a substrate having two main surfaces and four end faces and is parallel to one of the end faces and a second axis of symmetry that passes through the central point and is perpendicular to the first axis of symmetry are respectively set and measurement points are set in the form of a grid with respect to the first axis of symmetry and the second axis of symmetry so as to measure heights of the main surface from a reference plane at the measurement points, respectively, and that (2) differences each between measured height values at those measurement points located at positions that are axisymmetric with respect to the first axis of symmetry are calculated (it is better to, likewise, also calculate differences each between the measured height values at those measurement points located at positions that are axisymmetric with respect to the second axis of symmetry) or differences each between measured height values at those measurement points located at positions that overlap each other when all the measurement points are rotated by 90 degrees about the central point as a rotation axis to cause all the measurement points before rotation and all the measurement points after the rotation to overlap each other are calculated, and those differences corresponding to at least 95% of the total number of the calculated differences between the measured height values are within a predetermined value.

With this configuration, it is possible to provide a mask blank substrate having a main surface shape with high symmetry (axisymmetry or rotational (point) symmetry). Therefore, it is possible to suppress the occurrence of deformation localized in one direction when chucked in an exposure apparatus and thus to reduce the change amount in main surface shape (the change amount in substrate shape) before and after chucking. As a result, it is possible to maintain the main surface to have high flatness, and thus to make very small the position offset caused by a photomask.

MODE FOR CARRYING OUT THE INVENTION

Hereinbelow, an exemplary embodiment of this invention will be described in detail with reference to the accompanying drawings.

A mask blank substrate of this invention is characterized in that (1) a first axis of symmetry that passes through a central point set on a main surface of a substrate having two main surfaces and four end faces and that is parallel to one of the end faces and a second axis of symmetry that passes through the central point and that is perpendicular to the first axis of symmetry are respectively set, and measurement points are set in the form of a grid with respect to the first axis of symmetry and the second axis of symmetry so as to measure heights of the main surface from a reference plane at the measurement points, respectively, and that (2) differences each between measured height values at those measurement points located at positions that are axisymmetric with respect to the first axis of symmetry are calculated, and those differences corresponding to at least 95% of the total number of the calculated differences between the measured height values are within a predetermined value.

Herein, the symmetry defined as above will be described.

Figure 1:
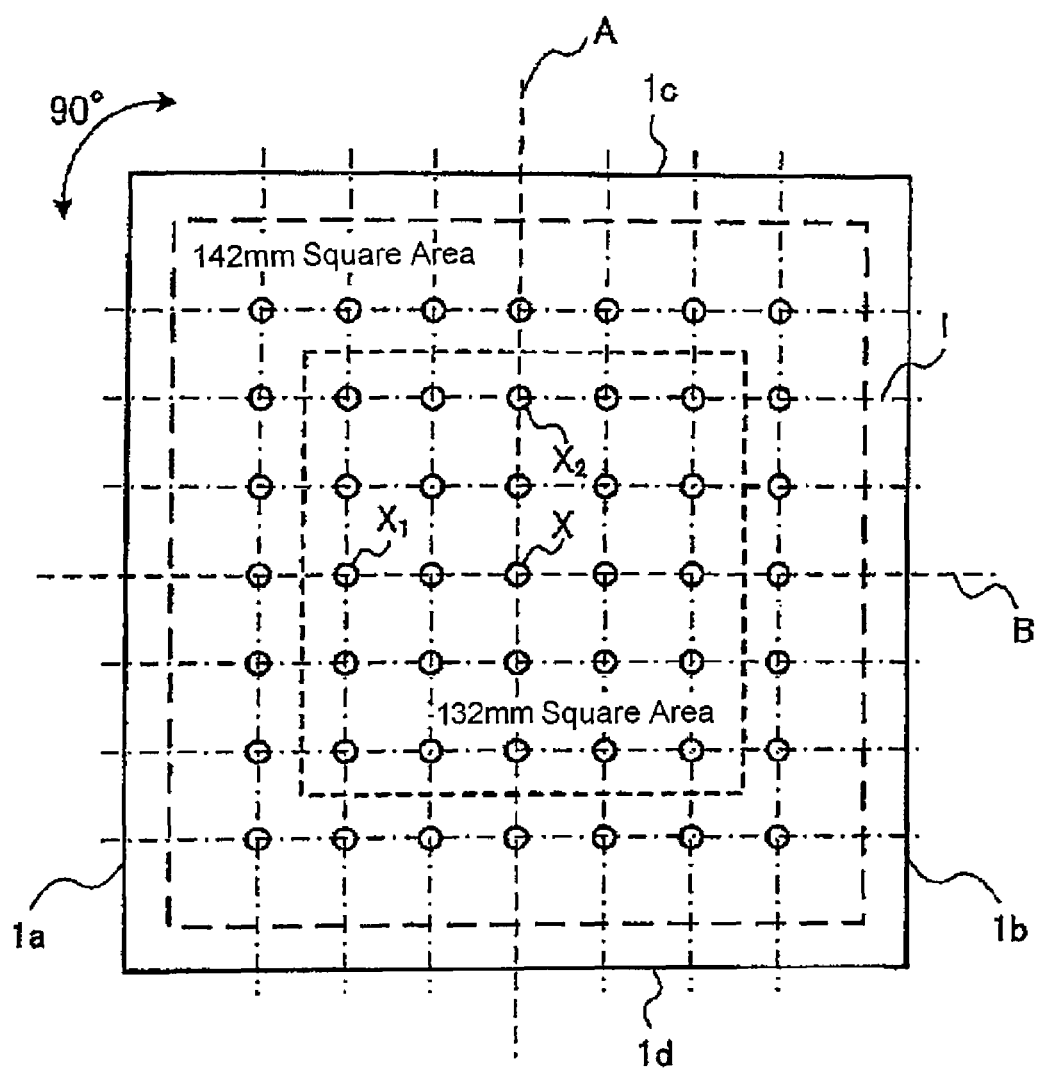
FIG. 1 is a plan view showing a main surface of a mask blank substrate according to an exemplary embodiment of this invention.

FIG. 1 is a plan view showing a mask blank substrate according to the exemplary embodiment of this invention. The mask blank substrate 1 shown in FIG. 1 is a square substrate having been subjected to predetermined polishing and a main surface shown in FIG. 1 is a main surface on the side where a thin film for transfer pattern formation is to be provided.

On this main surface, a first axis A of symmetry which is parallel to and equidistant from left and right both end faces 1a and 1b and a second axis B of symmetry which is parallel to and equidistant from upper and lower both end faces 1c and 1d are respectively set. Further, in an area of, for example, 132 mm square (an area surrounded by a broken line) of the main surface, a virtual grid (chain line) is set at predetermined intervals with respect to the axis A of lateral symmetry and the axis B of vertical symmetry and intersections (circle marks) of the grid are set as measurement points.

Figure 2:
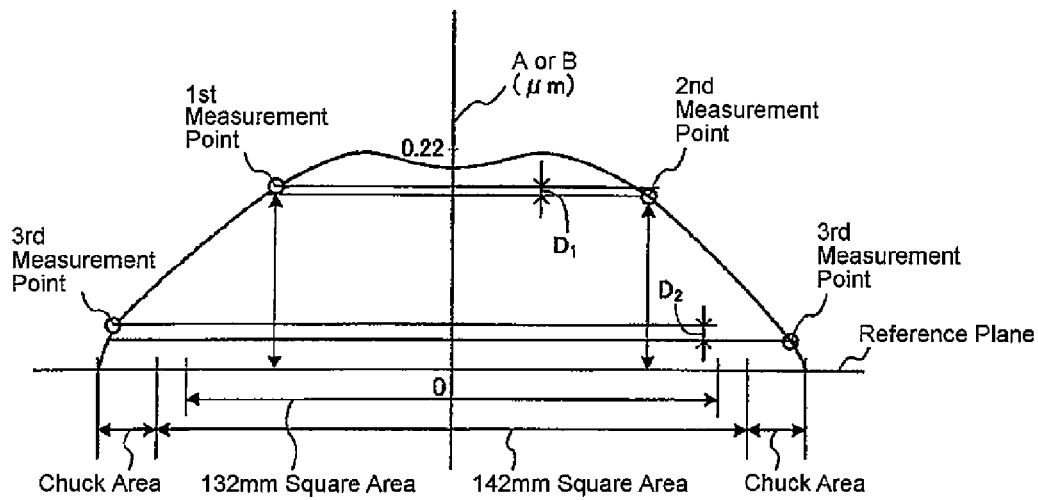
FIG. 2 is a side view showing the main surface of the mask blank substrate according to the exemplary embodiment of this invention.

The symmetry in the mask blank substrate according to this invention is defined such that, as shown in FIG. 2, for example, the height of the main surface from a reference plane is measured at measurement points (e.g. first and second measurement points) in the 132 mm square area (the area surrounded by the broken line in FIG. 1) of the main surface, a difference (D1) between measured height values at both measurement points (first and second measurement points), which are in a relationship of being laterally equidistant from the first axis A of symmetry in a direction perpendicular to the first axis A of symmetry, is calculated, and this measured height value difference calculation is carried out at respective measurement points, wherein, with respect to these calculated measured height value differences, those differences corresponding to at least 95% of the total number thereof (the total number of the calculated differences) are within a predetermined value (e.g. within 10 nm).

Figure 3:
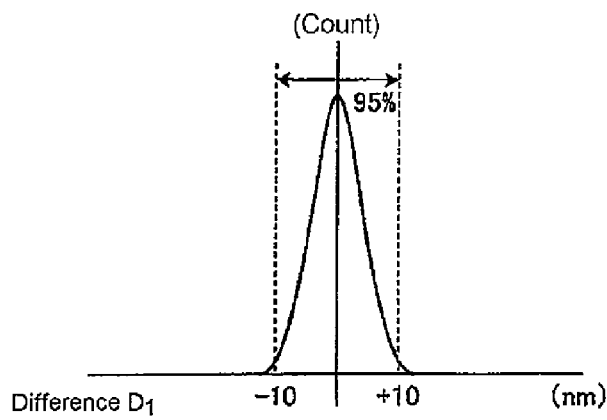
FIG. 3 is a diagram showing the relationship between the difference between measurement points and the number of measurement points.

That is, this symmetry represents that when, as shown in FIG. 2, the height of the main surface from a reference plane is measured at respective measurement points which are in a relationship of being laterally equidistant from the first axis A of symmetry, then differences each between both measurement results are calculated at the respective measurement points, and then the number of the calculated differences is counted, those differences corresponding to at least 95% of the total number of the calculated differences fall within a predetermined value (within ±10 nm) as shown in FIG. 3. As a consequence, high symmetry of the main surface can be ensured at least with respect to the first axis A of symmetry. Accordingly, particularly in the case where chuck areas (see FIG. 5) of an exposure apparatus are located in a direction of the first axis A of symmetry, a substrate deformation force is applied symmetrically so that it is possible to suppress the flatness change amount of the main surface and thus to realize high flatness thereof.

Further, in order to reliably achieve high flatness also in the case where the chuck areas of the exposure apparatus are located in a direction of the second axis B of symmetry, it is also required that, likewise, a difference (D1) between the measured height values at both measurement points, which are in a relationship of being vertically equidistant from the second axis B of symmetry in a direction perpendicular to the second axis B of symmetry, be calculated, and this measured height value difference calculation be carried out at the respective measurement points, wherein, with respect to these calculated measured height value differences, those differences corresponding to at least 95% of the total number thereof be within the predetermined value (e.g. 10 nm).

In order to further improve the flatness of the main surface, it is required to improve the flatness of the main surface before chucking in the exposure apparatus and thus it is preferable to add a condition that the flatness of the main surface in the 132 mm square area is 0.3 μm or less.

Alternatively, the symmetry in the mask blank substrate according to this invention is defined such that, using the virtual grid and the measurement points shown in FIG. 1, differences are calculated each between a measurement point (e.g. a measurement point X1) before rotation and a (different) measurement point (e.g. a measurement point X2) after the rotation that overlap each other when all the measurement points are rotated (in an arrow direction in FIG. 1) by 90 degrees about a rotation axis (an axis from the sheet front side to the sheet back side), which crosses both the first axis A of symmetry and the second axis B of symmetry at right angles at their intersection X, to overlap all the measurement points before the rotation in the 132 mm square area of the main surface and, as shown in FIG. 3, those differences corresponding to at least 95% of the total number of the calculated measured height value differences are within a predetermined value (e.g. 10 nm).

That is, this symmetry represents that when the height of the main surface from a reference plane is measured at respective measurement points that overlap each other when the measurement points are rotated about a direction which is perpendicular to the first axis A of symmetry and the second axis B of symmetry and which passes through the sheet at their intersection X, then differences each between both measurement results are calculated, and then the number of the calculated differences is counted, those differences corresponding to at least 95% of the total number of the calculated differences fall within a predetermined value (within ±10 nm) as shown in FIG. 3.

As a consequence, high symmetry of the entire main surface can be ensured. Accordingly, regardless of whether chuck areas (see FIG. 5) of an exposure apparatus are located in a direction of the first axis A of symmetry or the second axis B of symmetry, a substrate deformation force is applied symmetrically so that it is possible to suppress the flatness change amount of the main surface and thus to realize high flatness thereof.

The mask blank substrate according to this invention is defined to be successful if those differences corresponding to at least 95% of the total number of the calculated differences between the measured height values are within the predetermined value. This numerical value of 95% corresponds to 2σ in the standard deviation which is used for evaluating the variation of products in the quality control. If the variation in accuracy is at this level, it can be said to be high accuracy of a level that is absorbed in accuracy errors of a film forming process for forming a thin film for transfer pattern formation, a photomask processing process, an exposure process, and so on thereafter. Further, it is also possible to suppress, within an allowable range, a reduction in product yield caused by manufacturing high-precision mask blank substrates of this invention. In the case where a higher precision main surface shape is required rather than the product yield, those differences corresponding to 3σ in the standard deviation (99.7%) of the total number of the calculated differences between the measured height values may be set to fall within the predetermined value.

In order to further improve the flatness of the main surface, it is required to improve the flatness of the main surface before chucking in the exposure apparatus and thus it is preferable to add a condition that the flatness of the main surface in the 132 mm square area is 0.3 μm or less. In general, in the case of a photomask for use in the manufacture of a semiconductor device, an area for forming a transfer pattern in a thin film for pattern formation is set within 132 mm×104 mm with respect to the center of a main surface. This is because it is necessary to consider the differences between the measured height values and the flatness at least in the 132 mm square area of the main surface, on the side where the thin film for pattern formation is to be formed, of the mask blank substrate.

Figure 4:
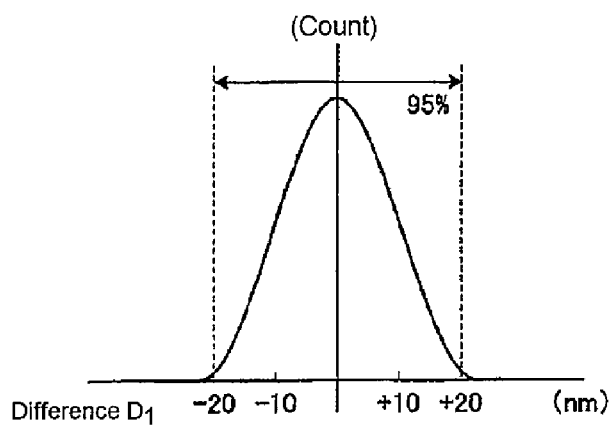
FIG. 4 is a diagram showing the relationship between the difference between measurement points and the number of measurement points.

Alternatively, the symmetry in the mask blank substrate according to this invention is defined such that, using the virtual grid and the measurement points shown in FIG. 1, as shown in FIG. 2, the height of the main surface from a reference plane is measured at measurement points (e.g. first and second measurement points) in a 142 mm square area of the main surface, a difference (D1) between measured height values at both measurement points (first and second measurement points), which are in a relationship of being laterally equidistant from the first axis A of symmetry in a direction perpendicular to the first axis A of symmetry, is calculated, and this measured height value difference calculation is carried out at respective measurement points, wherein, with respect to these calculated measured height value differences, those differences corresponding to at least 95% of the total number thereof are within ±20 nm as shown in FIG. 4. As a consequence, higher symmetry of the main surface can be ensured at least with respect to the first axis A of symmetry in the wider area of 142 mm square of the main surface. Accordingly, particularly in the case where chuck areas (see FIG. 5) of an exposure apparatus are located in a direction of the first axis A of symmetry, a substrate deformation force is applied symmetrically so that it is possible to further suppress the flatness change amount of the main surface and thus to realize high flatness thereof.

Further, in order to reliably achieve high flatness also in the case where the chuck areas of the exposure apparatus are located in a direction of the second axis B of symmetry, it is also required that, likewise, a difference (D1) between the measured height values at both measurement points, which are in a relationship of being vertically equidistant from the second axis B of symmetry in a direction perpendicular to the second axis B of symmetry, be calculated, and this measured height value difference calculation be carried out at the respective measurement points, wherein, with respect to these calculated measured height value differences, those differences corresponding to at least 95% of the total number thereof be within the predetermined value (e.g. 20 nm).

In order to further improve the flatness of the main surface, it is required to improve the flatness of the main surface before chucking in the exposure apparatus and thus it is preferable to add a condition that the flatness of the main surface in the 142 mm square area is 0.3 μm or less.

Alternatively, the symmetry in the mask blank substrate according to this invention is defined such that, using the virtual grid and the measurement points shown in FIG. 1, differences are calculated each between a measurement point (e.g. a measurement point X1) before rotation and a (different) measurement point (e.g. a measurement point X2) after the rotation that overlap each other when all the measurement points are rotated (in an arrow direction in FIG. 1) by 90 degrees about a rotation axis (an axis from the sheet front side to the sheet back side), which crosses both the first axis A of symmetry and the second axis B of symmetry at right angles at their intersection X, to overlap all the measurement points before the rotation in a 142 mm square area of the main surface and, as shown in FIG. 4, those differences corresponding to at least 95% of the total number of the calculated measured height value differences are within a predetermined value (e.g. 20 nm). As a consequence, high symmetry of the entire main surface can be ensured in the wider area of 142 mm square of the main surface. Accordingly, regardless of whether chuck areas (see FIG. 5) of an exposure apparatus are located in a direction of the first axis A of symmetry or the second axis B of symmetry, a substrate deformation force is applied symmetrically so that it is possible to suppress the flatness change amount of the main surface and thus to realize high flatness thereof.

In a photomask finally produced based on the mask blank substrate, a pellicle like the one described before is often attached to an upper surface of a thin film for transfer pattern formation formed with a transfer pattern. This pellicle may be attached to the 132 mm square area of the main surface and is often attached to the 142 mm square area thereof. Since a deformation force is applied to the substrate at a portion where the pellicle is attached, it is meaningful to consider the differences between the measured height values and the flatness also in the 142 mm square area.

In order to further improve the flatness of the main surface, it is required to improve the flatness of the main surface before chucking in the exposure apparatus and thus it is preferable to add a condition that the flatness of the main surface in the 142 mm square area is 0.3 µm or less.

Figure 5:
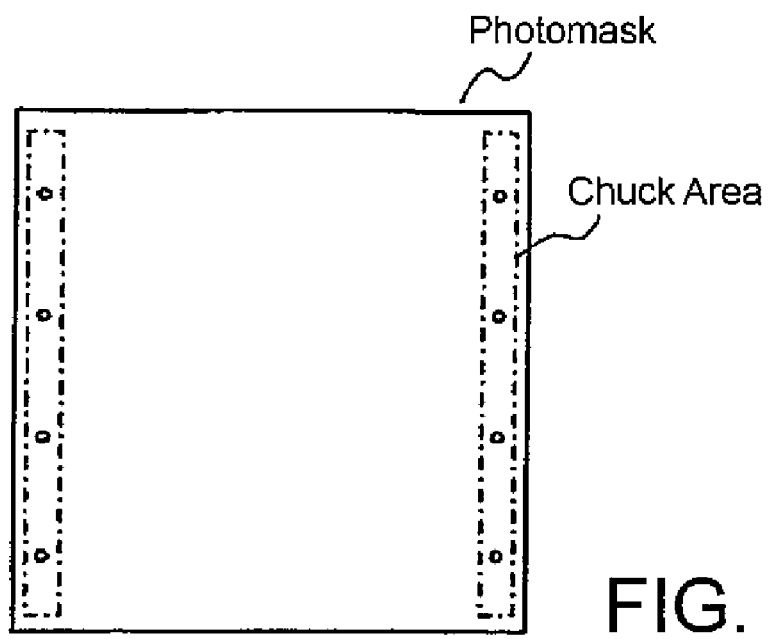
FIG. 5 is a diagram for explaining measurement points in chuck areas of a mask stage.
Figure 6:
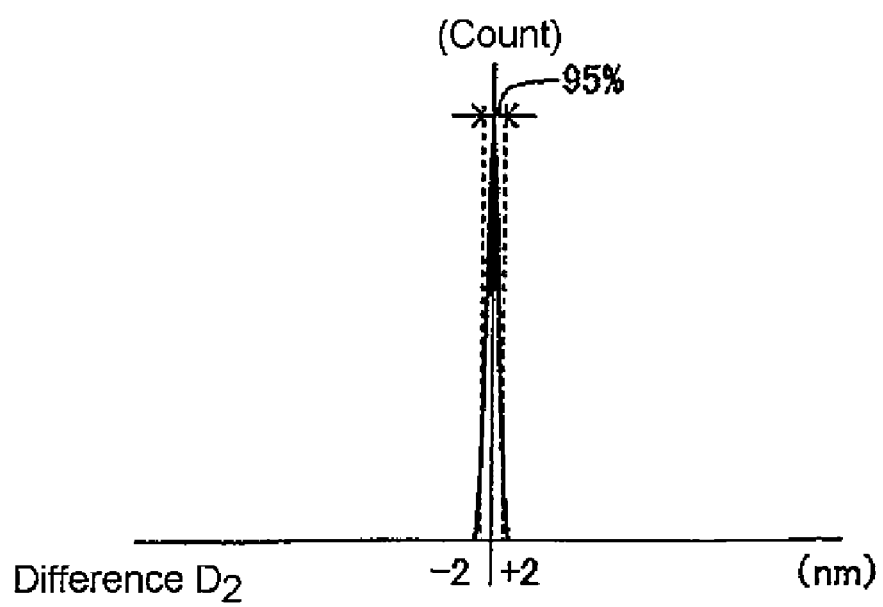
FIG. 6 is a diagram showing the relationship between the difference between measurement points and the number of measurement points.

Further, with respect to differences each between measured height values (measured at third measurement points (circle marks) in FIG. 2) that are calculated in chuck areas, shown in FIG. 5, of the main surface serving as areas that are suction-chucked when a photomask having a thin film on the main surface and formed with a transfer pattern in the thin film is mounted in the exposure apparatus, those differences D2 corresponding to at least 95% of the total number of the calculated differences are preferably within 2 nm as shown in FIG. 6 (see FIG. 2).

As a consequence, by ensuring the symmetry of the areas where a chuck force of the exposure apparatus is directly applied, a deformation force applied to the substrate becomes substantially symmetrical so that it is possible to largely suppress the flatness change amount of the main surface and thus to realize very high flatness thereof.

While the miniaturization of semiconductor devices has been accelerated, the reduction in wavelength of the conventional light exposure is approaching the exposure limit. In view of this, as a high-resolution exposure technique, the EUV lithography (hereinafter referred to as "EUVL") being an exposure technique using EUV light with a shorter wavelength than an ArF excimer laser is expected to be promising. Herein, the EUV light represents light in a wavelength band of the soft X-ray region or the vacuum ultraviolet region and, specifically, light having a wavelength of about 0.2 nm to 100 nm. As a photomask (reflective mask) for this EUV light, there can be cited, for example, an exposure reflective mask in which a reflective layer having a multilayer film structure is formed on a substrate and an absorber for absorbing a soft X-ray or a vacuum ultraviolet ray is formed in a pattern on the reflective layer.

In a reflective mask for EUV light, a main surface having a multilayer reflective film has a high compressive stress and thus is deformed into a convex surface while its back surface (i.e. a main surface on the side to be attracted by a chuck) becomes a concave surface. This reflective mask is fixed by an electrostatic chuck when it is mounted in an exposure apparatus. In this case, since attraction spreads from contact points between a mask substrate and a mask stage, the mask substrate is brought into contact with the mask stage from the outer side and an attractive force spreads inward. In the case of this reflective mask, since its back surface (surface to be attracted) is the concave surface due to the high compressive stress by the multilayer reflective film, its outer side portions are first brought into contact with the mask stage. There is a problem that a gap formed at the central portion in this event is not completely eliminated so that attraction failure is resulted or even if attracted, the substrate is not completely cured (flattened). Therefore, in the EUV mask, the back surface is also required to have higher flatness and it is desirable that the back surface also have high symmetry.

In a mask blank substrate for an EUV mask according to this invention, the symmetry of its back surface (a main surface on the side opposite to the side where a thin film for transfer pattern formation is to be provided) is defined such that, as shown in FIG. 2, the height of the main surface from a reference plane is measured at measurement points (e.g. first and second measurement points) in a 142 mm square area (an area surrounded by a broken line) of the main surface, differences (D1) each between measured height values at both measurement points (first and second measurement points), which are in a relationship of being laterally equidistant from the first axis A of symmetry in a direction perpendicular to the first axis A of symmetry, are calculated, and differences (D1) each between the measured height values at both measurement points (first and second measurement points), which are in a relationship of being vertically equidistant from the second axis B of symmetry in a direction perpendicular to the second axis B of symmetry, are calculated, wherein those differences corresponding to at least 95% of the total number of the calculated differences between the measured height values are within 5 nm.

As a consequence, high symmetry can be ensured in the 142 mm square area of the main surface on the back side and, therefore, even if a chuck force is applied to the entire back surface, it is possible to suppress the flatness change amount of the main surface on the back side and simultaneously also to suppress the flatness change amount of a main surface on the front side (the side where the thin film for transfer pattern formation is to be provided) so that high flatness can be realized.

The same effect can be obtained by calculating differences between the measured height values in a rotational symmetry in which all the measurement points are rotated by 90 degrees about a rotation axis that crosses both the first axis A of symmetry and the second axis B of symmetry at right angles at their intersection X.

The shape and differences in height of the mask blank substrate can be derived as described above by measuring TTV (thickness variation) with a wavelength-shift interferometer using a wavelength modulation laser. This wavelength-shift interferometer calculates, as phase differences, differences in height of a measured surface of a mask blank substrate from interference fringes generated by the interference between reflected light reflected from the measured surface and a back surface of the mask blank substrate and a measuring apparatus reference surface (front reference surface), detects differences in frequency of the interference fringes, and separates the interference fringes generated by the interference between the reflected light reflected from the measured surface and the back surface of the mask blank substrate and the measuring apparatus reference surface (front reference surface), thereby measuring the shape of irregularities of the measured surface.

Figure 7:
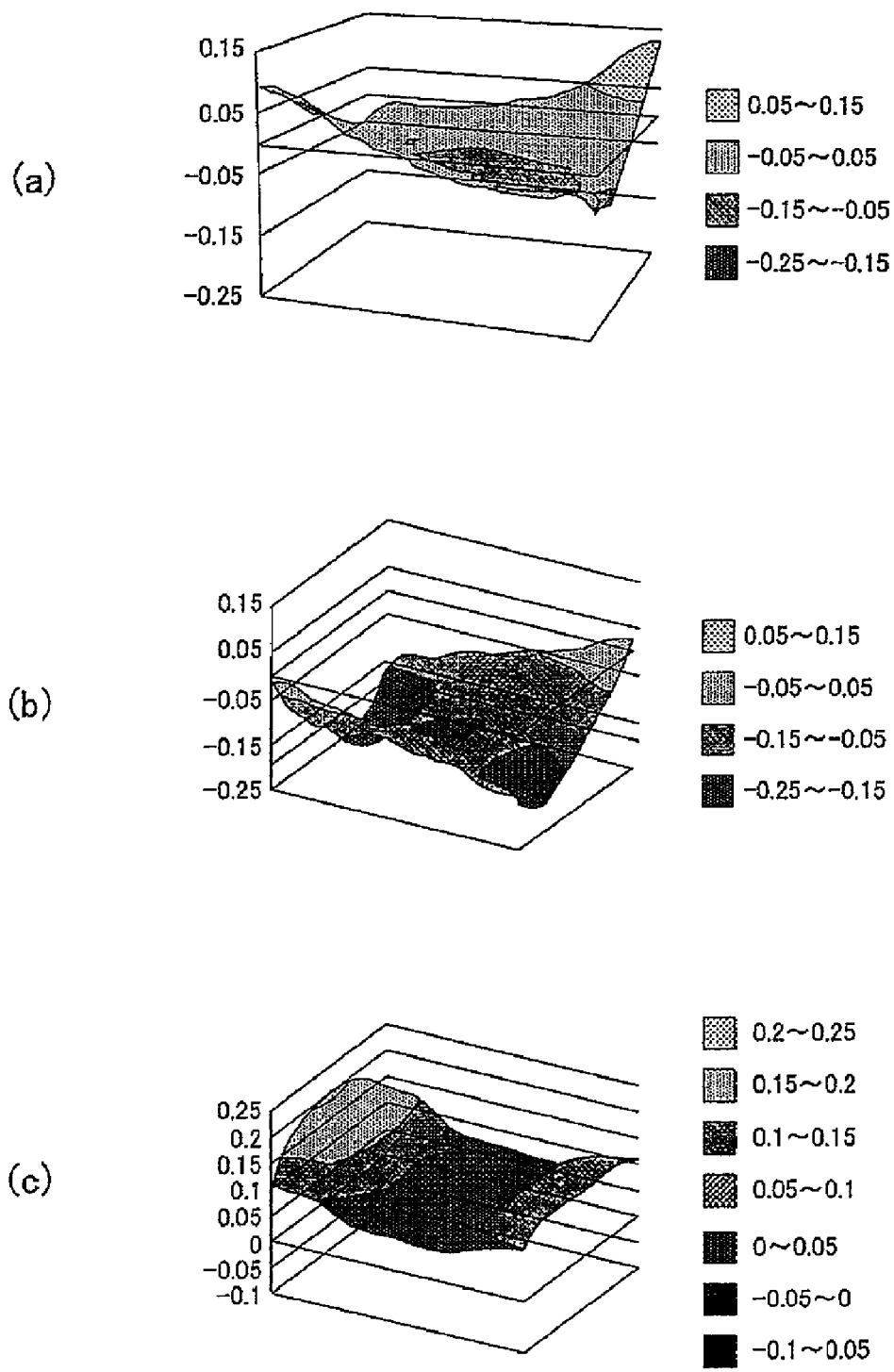
FIGS. 7(a) to 7(c) show the shape of a main surface of a substrate not having the symmetry according to this invention.

In the case of a substrate having a distorted shape not having the above-mentioned symmetry, when a photomask is chucked on a mask stage of an exposure apparatus, the flatness of the photomask is largely degraded. For example, the shape of the substrate having the distorted shape before suction to the mask stage of the exposure apparatus is as shown in FIG. 7(a). When the substrate having such a shape is sucked to the mask stage of the exposure apparatus, the shape of the substrate becomes as shown in FIG. 7(b). FIG. 7(b) is a diagram estimating the surface shape when the substrate is sucked to the mask stage of the exposure apparatus. This estimation of the surface shape is carried out by simulation based on the mask chuck structure of the exposure apparatus and the flatness of the main surface of the mask blank substrate obtained in advance (see JP-A-2004-157574). As seen from FIG. 7(b), in the state of being sucked to the mask stage, the substrate has a shape that is largely distorted and thus tends to degrade the overlay accuracy. The amount of change in shape of this substrate before and after suction to the exposure apparatus is as shown in FIG. 7(c).

Figure 8:
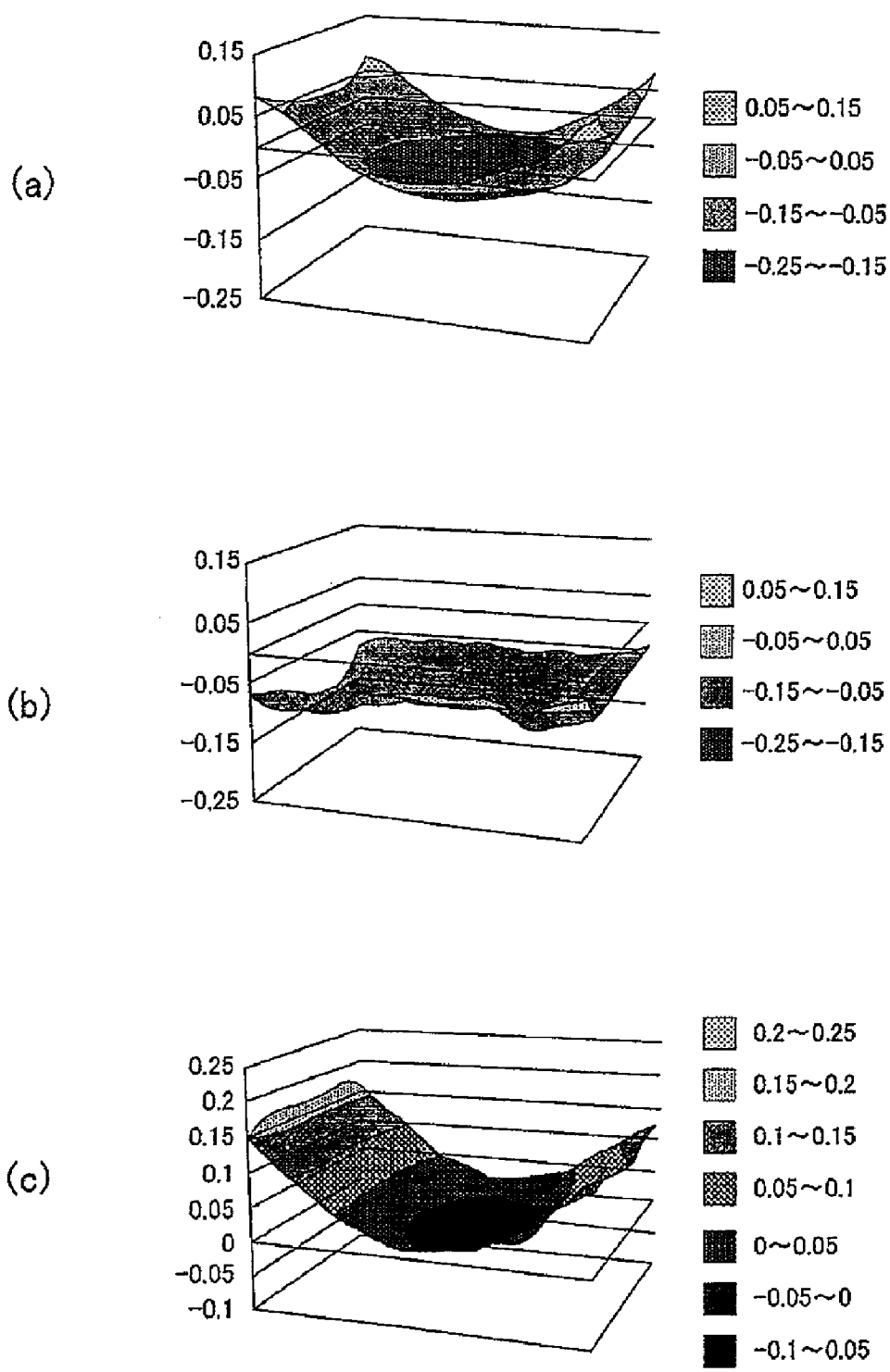
FIGS. 8(a) to 8(c) show the shape of a main surface of a substrate having the symmetry according to this invention.

On the other hand, in the case of the substrate according to this invention having the above-mentioned symmetry, when a photomask is chucked on the mask stage of the exposure apparatus, the photomask becomes substantially flat. For example, the shape of the substrate having the above-mentioned symmetry before suction to the mask stage of the exposure apparatus is as shown in FIG. 8(a). When the substrate having such a shape is sucked to the mask stage of the exposure apparatus, the shape of the substrate becomes as shown in FIG. 8(b). FIG. 8(b) is a diagram estimating the surface shape when the substrate is sucked to the mask stage of the exposure apparatus. This estimation of the surface shape is carried out in the same manner as described above (see JP-A-2004-157574). As seen from FIG. 8(b), in the state of being sucked to the mask stage, the substrate has a shape that is substantially flat and thus does not cause degradation of the overlay accuracy. The amount of change in shape of this substrate before and after suction to the exposure apparatus is as shown in FIG. 8(c).

While the shapes before suction to the mask stage of the exposure apparatus have the same flatness of 0.3 µm in the substrate not having the symmetry according to this invention and the substrate having the symmetry according to this invention, the shapes after suction to the mask stage of the exposure apparatus are completely different from each other. That is, it is seen that the mask blank substrate needs to have the symmetry according to this invention in order to make flat the shape after suction to the mask stage of the exposure apparatus.

In semiconductor manufacturing processes, when forming a laminated structure having a circuit pattern of a semiconductor device, a photolithography process is carried out for each of layers. In the circuit pattern, it is necessary to form wiring also between the upper and lower layers. Therefore, the overlay accuracy of patterns of the respective layers is important. Particularly, with the pattern miniaturization and the increase in pattern density in recent years, high overlay accuracy is required for a set of photomasks that are used in forming a laminated structure of a semiconductor device.

With respect to such a set of photomasks, even if a pattern can be formed with high position accuracy in each photomask, if the main surface shapes of substrates in the respective photomasks differ from each other, deformation tendencies of the substrates when the photomasks are vacuum-chucked in an exposure apparatus differ from each other. Further, since this also causes different tendencies in position offset of the patterns on the substrates, the overlay accuracy of the two photomasks is degraded. Therefore, with respect to a substrate set for use in a photomask set that are used in forming a laminated structure having a circuit pattern of a semiconductor device on a wafer, it is desirable that the shapes of main surfaces, on the side where a pattern is to be formed, be close to each other.

On the other hand, in recent years, the pattern miniaturization and the increase in pattern density have advanced significantly so that the formation of a fine, high-density pattern in a single mask has been subjected to a limit. As one of means for solving this lithography technique problem, the double patterning/double exposure (DP/DE) techniques have been developed. The double patterning/double exposure techniques are the same until a single fine, high-density pattern is divided into two relatively coarse patterns (a first pattern and a second pattern) to thereby produce photomasks (a first photomask and a second photomask) formed with the two patterns, respectively.

In the case of the double patterning technique, first, an exposure process for transferring a first pattern onto a first resist film coated on an outermost layer (conductive layer, insulating layer, semiconductor layer, hard mask, or the like) of a wafer of a semiconductor device is carried out using a first photomask and then a development process is carried out, thereby transferring the first pattern to the first resist film (formation of a first resist pattern). Then, the outermost layer is dry-etched using the first resist film pattern as an etching mask, thereby transferring the first pattern to the outermost layer. Then, the first resist pattern is stripped and a second resist film is coated on the outermost layer. Then, an exposure process for transferring a second pattern onto the second resist film is carried out using a second photomask and then a development process is carried out, thereby transferring the second pattern to the second resist film (formation of a second resist pattern). Then, the outermost layer is dry-etched using the second resist film pattern as an etching mask, thereby transferring the second pattern to the outermost layer. By carrying out these processes, a fine, high-density pattern in combination of the first pattern and the second pattern can be transferred to the outermost layer of the semiconductor device.

On the other hand, in the case of the double exposure technique, with respect to a resist film coated on an outermost layer (conductive layer, insulating layer, semiconductor layer, hard mask, or the like) of a wafer of a semiconductor device, an exposure process for transferring a first pattern is carried out using a first photomask and then an exposure process for transferring a second pattern is carried out using a second photomask. Thus, the exposure is carried out twice with respect to the same resist film. Then, by applying a development process to the resist film after these processes, a fine, high-density pattern in combination of the first pattern and the second pattern can be transferred to the resist film. Then, the fine, high-density pattern is transferred to the outermost layer of the semiconductor device according to the usual process.

In either of the double patterning/double exposure (DP/DE) techniques, the overlay accuracy of the first pattern and the second pattern exposed which are transferred using the set of the two photomasks largely affects the semiconductor device pattern transfer accuracy (if the overlay accuracy is low, serious problems occur for the semiconductor device such as a large change in width of a conductor formed in the semiconductor device and the occurrence of a disconnection or short.). Even if a pattern can be formed with very high position accuracy in each photomask, if the main surface shapes of substrates in the set of the two photomasks differ from each other, deformation tendencies of the substrates when the photomasks are vacuum-chucked in an exposure apparatus differ from each other. Further, since this also causes different tendencies in position offset of the patterns on the substrates, the overlay accuracy of the two photomasks is largely degraded. Therefore, with respect to a substrate set for use in a set of two photomasks that are used in the double patterning/double exposure (DP/DE) technique, it is desirable that the shapes of main surfaces, on the side where a pattern is to be formed, be close to each other. Accordingly, with respect to the substrate set for use in the set of two photomasks that are used in the double patterning/double exposure (DP/DE) technique, it is preferable to use substrates each having a main surface with the above-mentioned symmetry according to this invention.

In this invention, a glass substrate can be used as a mask blank substrate. The glass substrate is not particularly limited as long as it can be used for a mask blank. For example, there can be cited a synthetic quartz glass, a soda-lime glass, an aluminosilicate glass, a borosilicate glass, an alkali-free glass, or the like. In the case of a glass substrate for an EUV reflective mask blank, in order to suppress the distortion of a transfer pattern due to heat in exposure, use is made of a glass material having a low thermal expansion coefficient in a range of about $0\pm1.0\times10^{-7}/°C$., more preferably in a range of about $0\pm0.3\times10^{-7}/°C$. Further, since the EUV reflective mask blank is formed with many films on the glass substrate, use is made of a high-rigidity glass material that can suppress deformation due to the film stress. Particularly, a glass material having a high Young's modulus of 65 GPa or more is preferable. For example, use is made of an amorphous glass such as a $SiO_2$—$TiO_2$-based glass or a synthetic quartz glass or a crystallized glass in which a β-quartz solid solution is precipitated.

Such a mask blank substrate can be manufactured through, for example, a rough polishing process, a precision polishing process, and an ultra-precision polishing process. In this event, the substrate to be manufactured is polished aiming at least to obtain a main surface having the above-mentioned symmetry. As a specific technique for producing a substrate having a shape excellent in symmetry, there can be cited magnetic fluid polishing (MRF (Magneto Rheological Finishing)) or the like.

Figure 10:
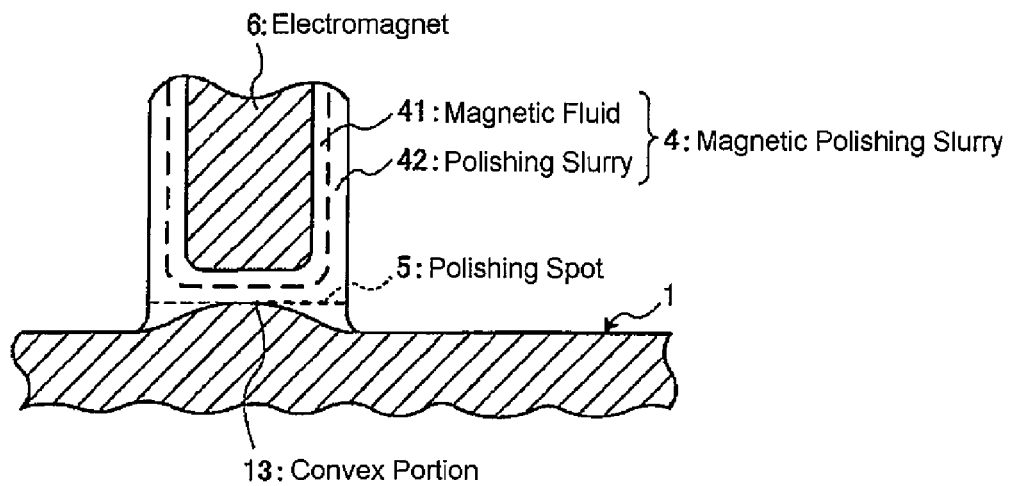
FIG. 10 is a schematic diagram for explaining a processing state by the MRF processing technique, wherein (a) shows a front cross-sectional view and (b) shows a side cross-sectional view.
Figure 10:
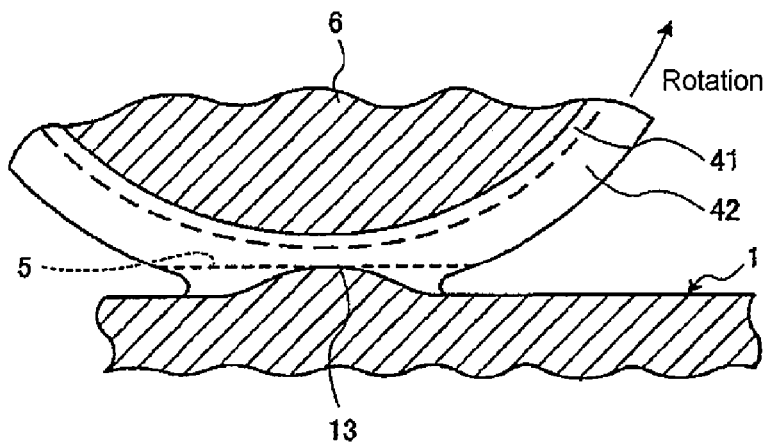

FIG. 10 is a schematic diagram for explaining a processing state by the MRF processing technique, wherein (a) shows a front cross-sectional view and (b) shows a side cross-sectional view. In the same figure, according to the MRF processing technique, a mask blank substrate 1 being a workpiece is locally polished by bringing polishing abrasive particles (not illustrated) contained in a magnetic fluid 41 containing iron (not illustrated) into contact with the mask blank substrate 1 at high speed by magnetic field assistance and by controlling the stay time of the polishing abrasive particles at a contact portion. That is, a mixed liquid (magnetic polishing slurry 4) of the magnetic fluid 41 and a polishing slurry 42 is loaded on a rotatably supported disk-shaped electromagnet 6 so that an outward end of the magnetic polishing slurry 4 is used as a polishing spot 5 for local processing, and a convex portion 13 to be removed is brought into contact with the polishing spot 5. With this configuration, the magnetic polishing slurry 4 flows along a disk-shaped magnetic field in a substantially two-layer state where the polishing slurry 42 is distributed much on the substrate 1 side while the magnetic fluid 41 is distributed much on the electromagnet 6 side. By using part of this state as the polishing spot 5 for carrying out local polishing and by bringing it into contact with a surface of the substrate 1, the convex portion 13 is locally polished and controlled to a flatness of several tens of nm.

In this MRF processing technique, as different from a conventional polishing method, the polishing spot 5 is constantly flowing and thus there is no degradation of processing accuracy due to abrasion of a processing tool or a change in shape thereof and, further, it is not necessary to press the substrate 1 under high load and therefore there is an advantage in that hidden cracks or cracks in a surface displacement layer are few. Further, in the MRF technique, the removal amount can be easily adjusted by controlling the moving speed of the substrate 1 according to a machining allowance (required processing amount) set per predetermined region, when moving the substrate 1 while keeping the polishing spot 5 in contact with the substrate 1.

As the polishing slurry 42 mixed into the magnetic fluid 41, use is made of a slurry in which fine polishing particles are dispersed in a liquid. The polishing particles are, for example, silicon carbide, aluminum oxide, diamond, cerium oxide, zirconium oxide, manganese oxide, colloidal silica, or the like and are properly selected according to a material of a workpiece, the processing surface roughness thereof, and so on. The polishing particles are dispersed into a liquid such as water, an acid solution, or an alkaline solution to form the polishing slurry 42 which is then mixed into the magnetic fluid 41.

By forming at least a light-shielding film, as a thin film for transfer pattern formation, on the main surface of the mask blank substrate described above, a mask blank can be obtained. As a material forming this light-shielding film, there can be cited chromium, tantalum, or a transition metal silicide represented by molybdenum silicide. In the case of a chromium-based light-shielding film, one or more elements selected from nitrogen, oxygen, carbon, fluorine, and boron may be added to chromium. In the case of a tantalum-based light-shielding film, one or more elements selected from nitrogen, oxygen, carbon, fluorine, and boron may be added to tantalum. As a transition metal in the transition metal silicide, there can be cited one of molybdenum, tantalum, tungsten, titanium, zirconium, vanadium, hafnium, niobium, nickel, palladium, ruthenium, and rhodium or an alloy thereof. Depending on the use and structure of a photomask, another film such as an antireflection film or a semi-transmissive film may be appropriately formed. As a material of the antireflection film, it is preferable to use CrO, CrON, CrOCN, or the like in the case of a chromium-based material, TaN, TaO, TaNO, TaBN, TaBO, TaBNO, or the like in the case of a tantalum-based material, or MoSiON, MoSiO, MoSiN, MoSiOC, MoSiOCN, or the like (in the case of another transition metal silicide, Mo in the above-mentioned MoSi compound may be replaced by a corresponding transition metal) in the case of a MoSi-based material. As a material of a phase shift film as a thin film for transfer pattern formation, it is preferable to use MSiON, MSiO, MSiN, MSiOC, MSiOCN (M: Mo, W, Ta, Zr, Ni, Ru, Rh, Pd, Hf, or the like), or the like.

The light-shielding film or the phase shift film can be formed by sputtering. As a sputtering apparatus, it is possible to use a DC magnetron sputtering apparatus, an RF magnetron sputtering apparatus, or the like. When sputtering the light-shielding film on the mask blank substrate, it is preferable to rotate the substrate and to dispose a sputtering target at a position inclined by a predetermined angle with respect to a rotation axis of the substrate, thereby forming the light-shielding film. By such a film forming method, it is possible to reduce in-plane variation of the light-shielding film and thus to uniformly form the light-shielding film.

Figure 9:
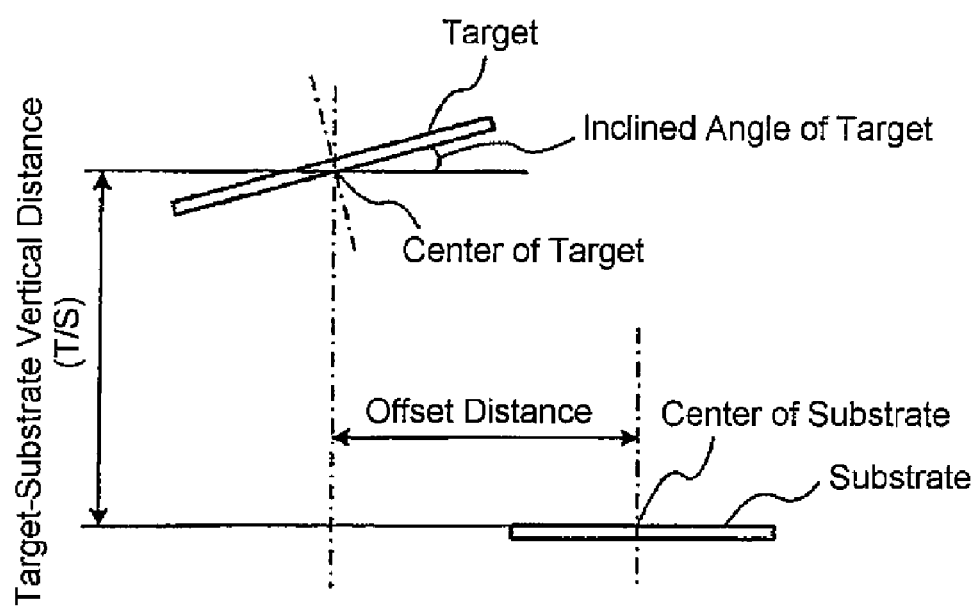
FIG. 9 is a diagram showing a schematic structure of a sputtering apparatus for use in manufacturing a mask blank according to the exemplary embodiment of this invention.

In the case of carrying out the film formation by rotating the substrate and by disposing the sputtering target at the position inclined by the predetermined angle with respect to the rotation axis of the substrate, the in-plane distributions of the phase angle and the transmittance also change by the positional relationship between the substrate and the target. The positional relationship between the target and the substrate will be explained with reference to FIG. 9. The offset distance (the distance between the central axis of the substrate and a straight line passing through the center of the target and parallel to the central axis of the substrate) is adjusted by an area in which the phase angle and transmittance distributions are to be ensured. In general, when such an area for ensuring the distributions is large, the required offset distance becomes long. In this exemplary embodiment, in order to realize a phase angle distribution within ±2° and a transmittance distribution within ±0.2% in 142 mm square of the substrate, the offset distance is required to be about 200 mm to 350 mm and is preferably 240 mm to 280 mm. The optimal range of the target-substrate vertical distance (T/S) changes depending on the offset distance, but in order to realize the phase angle distribution within ±2° and the transmittance distribution within ±0.2% in 142 mm square of the substrate, the target-substrate vertical distance (T/S) is required to be about 200 mm to 380 mm and is preferably 210 mm to 300 mm. The target inclination angle affects the film forming rate and, in order to obtain a high film forming rate, the target inclination angle is suitably 0° to 45° and preferably 10° to 30°.

By patterning at least the light-shielding film described above by photolithography and etching to form a transfer pattern, a photomask can be manufactured. An etchant for etching is properly changed depending on a material of a film to be etched.

The structure of a reflective mask blank for EUV light is generally such that a multilayer reflective film, a protective film (may be not provided), a buffer film (may be not provided), and an absorber film (a thin film for transfer pattern formation) are laminated on a main surface on the side where a thin film for transfer pattern formation is to be provided, while, a back-side film to be chucked on a chuck stage of an EUV exposure apparatus or a film forming apparatus is formed on a main surface on the opposite side. Since the chuck stage of the EUV exposure apparatus or the film forming apparatus often employs an electrostatic chuck, the back-side film is preferably a conductive back-side film having conductivity. In this case, as the back-side film, a Cr metal, a Cr compound containing Cr and one or more elements selected from O, N, C, B, and F, or the like is preferable in the case of a Cr-based material. On the other hand, in the case of a Ta-based material, a Ta metal, TaB, TaN, TaO, TaBN, TaBO, TaNO, TaBNO, or the like is preferable. The back-side film may be a single layer or a multilayer film of the above-mentioned materials.

The multilayer reflective film is required to reflect EUV light at high reflectance (at least 60% or more) and has a structure in which low refractive index layers made of a low refractive index material (Si or the like) and high refractive index layers made of a high refractive index material (Mo or the like) in combination are alternately laminated by 30 to 60 cycles. For example, as a multilayer reflective film applicable to EUV light with a wavelength of 13 to 14 nm, use is preferably made of a Mo/Si cycle multilayer film in which Mo films and Si films are alternately laminated by about 40 cycles. Other than this, there are a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, and so on.

The protective film serves to protect an outermost surface of the multilayer reflective film so as not to be damaged during dry etching to form a transfer pattern in the absorber film and serves to suppress surface oxidation of the outermost surface. As a material suitable for the protective film, there is a Ru metal, a Ru compound, RuNb, RuZr, or the like in the case of a Ru-based material or $SiO_2$, SiON, or the like in the case of a Si-based material.

The buffer film serves to protect an outermost surface of the multilayer reflective film so as not to be damaged during dry etching to form a transfer pattern in the absorber film and serves to protect the outermost surface of the multilayer reflective film so as not to be damaged when correcting a defect, if there is the defect in the absorber film formed with the transfer pattern, using FIB (Focused Ion Beam). As a material suitable for the buffer film, a Cr-based material can be cited and there is a Cr metal, a Cr compound (CrN, CrO, CrC, CrON, CrOC, or CrOCN), or the like.

The absorber film is a thin film for transfer pattern formation and use is made of a film having a high absorptivity for EUV light. A tantalum-based material is most used as the absorber film and a Ta metal or a Ta compound (TaB, TaN, TaO, TaNO, TaBN, TaBO, TaBNO, or the like) is preferable. A tantalum silicide-based material (TaSi, TaSiN, TaSiO, TaSiON, or the like) is also applicable. Since DUV light (150 to 400 nm) is often used as inspection light in pattern defect inspection of the absorber film after a transfer pattern is formed by an etching process, the absorber film may have a two-layer structure in which a lower layer is an absorbing layer made of a material having a high absorptivity for EUV light and an upper layer is a low reflective layer made of a material having a low reflectance for DUV light. In this case, as the lower layer, use is made of a material which is applicable to the above-mentioned absorber film. As the upper layer, a material having a relatively low reflectance for DUV light (a material with a high oxidation degree or a high nitriding degree) is used among the above-mentioned materials or use is made of a Si-based oxide, nitride, or oxynitride material such as SiON, a Cr-based oxide, nitride, or oxynitride material such as CrON, or the like.

EXAMPLE 1

Next, a description will be given of Example 1 which was carried out for clarifying the effect of this invention.

A glass substrate obtained by lapping and chamfering a synthetic quartz glass substrate was subjected to a rough polishing process under the following polishing conditions. After the rough polishing process, the glass substrate was ultrasonically cleaned for removing polishing abrasive particles adhering to the glass substrate. The polishing conditions such as the processing pressure, the rotational speeds of upper and lower surface plates, and the polishing time were properly adjusted.

Polishing Liquid: cerium oxide (average particle size 2 μm to 3 μm) +water

Polishing Pad: hard polisher (urethane pad)

Then, the glass substrate after the rough polishing was subjected to a precision polishing process under the following polishing conditions. After the precision polishing process, the glass substrate was ultrasonically cleaned for removing polishing abrasive particles adhering to the glass substrate.

The polishing is carried out by adjusting various conditions so that the shape of a main surface, on the side where a transfer pattern is to be formed, of the glass substrate after the precision polishing process becomes convex at four corners. This is because the next ultra-precision polishing process has a feature to preferentially polish four corners of the substrate main surface, and thus this makes it possible to suppress edge exclusion at the four corners and to achieve a flatness of 0.3 μm or less in 142 mm square of the substrate main surface.

Polishing Liquid: cerium oxide (average particle size 1 μm)+water
Polishing Pad: super-soft polisher (suede type)

Then, the glass substrate after the precision polishing was subjected to the ultra-precision polishing process under the following polishing conditions. After the ultra-precision polishing process, the glass substrate was ultrasonically cleaned for removing polishing abrasive particles adhering to the glass substrate. The polishing conditions such as the processing pressure, the rotational speeds of upper and lower surface plates, and the polishing time were properly adjusted. In this ultra-precision polishing process, there is the feature that the four corners tend to be preferentially polished due to the substrate shape being square. The polishing conditions are set so that the flatness in 142 mm square of the substrate main surface does not exceed 0.3 μm while the surface roughness of the substrate main surface becomes a predetermined roughness of 0.4 nm or less. In this manner, the glass substrate (152.4 mm×152.4 mm×6.35 mm) according to this invention was manufactured.

Polishing Liquid: colloidal silica (average particle size 100 nm) +water
Polishing Pad: super-soft polisher (suede type)

The flatness and symmetry of the main surface of the glass substrate thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in a 132 mm square area of the main surface, intersections of the grid were set as measurement points, and the height of the main surface from a reference plane was measured at the respective measurement points. Then, (2) a flatness in the 132 mm square area of the substrate was calculated from measured values and the substrate having a flatness greater than 0.3 μm was judged to be an unsuccessful product. Further, (3) differences each between the measured height values at both measurement points, which were in a relationship of being laterally equidistant from the first axis of symmetry in a direction perpendicular to the first axis of symmetry, were calculated, differences each between the measured height values at both measurement points, which were in a relationship of being vertically equidistant from the second axis of symmetry in a direction perpendicular to the second axis of symmetry, were calculated, and a judgment was made as to whether or not those differences corresponding to at least 95% of the total number of the calculated differences between the measured height values were within 10 nm.

As a result of the judgment, the substrate having the symmetry according to this invention is judged to be a usable successful product. The local processing by the MRF processing technique is applied to the glass substrate in which an area for the local processing is specified if it is required to be subjected to the local processing. That is, the substrate is locally polished by bringing polishing abrasive particles contained in a magnetic fluid into contact with the substrate by magnetic field assistance and by controlling the stay time of the polishing abrasive particles at a contact portion. In this polishing, as the convex degree of a convex portion increases, the stay time of the polishing abrasive particles at the contact portion is set longer. On the other hand, as the convex degree of a convex portion decreases, the stay time of the polishing abrasive particles at the contact portion is controlled to be shorter.

Then, a back-surface antireflection layer, a light-shielding layer, and a front-surface antireflection layer were formed in this order as a light-shielding film (a thin film for transfer pattern formation) on the glass substrate thus obtained. Specifically, using a Cr target as a sputtering target and using a mixed gas of Ar, $CO_2$, $N_2$, and He (gas flow rate ratio Ar:$CO_2$:$N_2$:He=24:29:12:35) as a sputtering gas, a CrOCN film was formed to a thickness of 39 nm as the back-surface antireflection layer by setting the gas pressure to 0.2 Pa and the power of the DC power supply to 1.7 kW. Then, using a Cr target as a sputtering target and using a mixed gas of Ar, NO, and He (gas flow rate ratio Ar:NO:He=27:18:55) as a sputtering gas, a CrON film was formed to a thickness of 17 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. In this manner, a mask blank was manufactured.

Then, two mask blanks each thus obtained were used as a mask blank set and, using the DP technique, two transfer patterns in the form of two relatively coarse patterns divided from a single fine, high-density transfer pattern corresponding to the DRAM hp32 nm generation were formed in the light-shielding films of the mask blanks through predetermined processes, respectively, thereby manufacturing a set of DP photomasks. Each of the DP photomasks was inspected by a mask inspection apparatus and found to satisfy the conditions required for a DP photomask of the DRAM hp32 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, two mask blanks each manufactured in the same manner as described above were used as a mask blank set and, using the DE technique, two transfer patterns in the form of two relatively coarse patterns divided from a single fine, high-density transfer pattern corresponding to the DRAM hp32 nm generation were formed in the light-shielding films of the mask blanks through predetermined processes, respectively, thereby manufacturing a set of DE photomasks. Each of the DE photomasks was inspected by a mask inspection apparatus and found to satisfy the conditions required for a DE photomask of the DRAM hp32 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks each manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 2

A plurality of glass substrates were obtained by carrying out a precision polishing process and an ultra-precision polishing process in the same manner as in Example 1. The flatness and symmetry of a main surface of each of the glass substrates thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in a 142 mm square area of the main surface, intersections of the grid were set as measurement points, and the height of the main surface from a reference plane was measured at the respective measurement points. Then, (2) a flatness in the 132 mm square area of the substrate was calculated from measured values and the substrate having a flatness greater than 0.3 µm was judged to be an unsuccessful product. Further, (3) differences were calculated each between the measured point before rotation and the (different) measurement point after the rotation that overlap each other when all the measurement points were rotated by 90 degrees about a rotation axis, which crosses both the first axis of symmetry and the second axis of symmetry at right angles at their intersection, to overlap all the measurement points before the rotation and a judgment was made as to whether or not those differences corresponding to at least 95% of the total number of the calculated differences between the measured height values were within 10 nm.

Then, in the same manner as in Example 1, a back-surface antireflection layer, a light-shielding layer, and a front-surface antireflection layer were formed in this order as a light-shielding film (a thin film for transfer pattern formation) on each of the glass substrates of the substrate set, thereby manufacturing mask blanks.

Then, using two mask blanks thus obtained as a mask blank set, a set of DP photomasks corresponding to the DRAM hp32 nm generation were manufactured in the same manner as in Example 1. Each of the DP photomasks was inspected by a mask inspection apparatus and found to satisfy the conditions required for a DP photomask of the DRAM hp32 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp32 nm generation were manufactured in the same manner as in Example 1. Each of the DE photomasks was inspected by a mask inspection apparatus and found to satisfy the conditions required for a DE photomask of the DRAM hp32 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 3

A plurality of glass substrates were obtained by carrying out a precision polishing process and an ultra-precision polishing process in the same manner as in Example 1. The flatness and symmetry of a main surface of each of the glass substrates thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in a 142 mm square area of the main surface, intersections of the grid were set as measurement points, and the height of the main surface from a reference plane was measured at the respective measurement points. Then, (2) a flatness in the 142 mm square area of the substrate was calculated from measured values and the substrate having a flatness greater than 0.3 µm was judged to be an unsuccessful product. Further, (3) differences each between the measured height values at both measurement points, which were in a relationship of being laterally equidistant from the first axis of symmetry in a direction perpendicular to the first axis of symmetry, were calculated, differences each between the measured height values at both measurement points, which were in a relationship of being vertically equidistant from the second axis of symmetry in a direction perpendicular to the second axis of symmetry, were calculated, and judgment was made as to whether or not those differences corresponding to at least 95 % of the total number of the calculated differences between the measured height values were within 20 nm.

Then, in the same manner as in Example 1, a back-surface antireflection layer, a light-shielding layer, and a front-surface antireflection layer were formed in this order as a light-shielding film (a thin film for transfer pattern formation) on each of the glass substrates of the substrate set, thereby manufacturing mask blanks.

Then, using two mask blanks thus obtained as a mask blank set, a set of DP photomasks corresponding to the DRAM hp22 nm generation were manufactured in the same manner as in Example 1. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 1. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 4

A plurality of glass substrates were obtained by carrying out a precision polishing process and an ultra-precision polishing process in the same manner as in Example 1. The flatness and symmetry of a main surface of each of the glass substrates thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in a 142 mm square area of the main surface, intersections of the grid were set as measurement points, and the height of the main surface from a reference plane was measured at the respective measurement points. Then, (2) a flatness in the 142 mm square area of the substrate was calculated from measured values and the substrate having a flatness greater than 0.3 μm was judged to be an unsuccessful product. Further, (3) differences were calculated each between the measurement point before rotation and the (different) measurement point after the rotation that overlap each other when all the measurement points were rotated by 90 degrees about a rotation axis, which crosses both the first axis of symmetry and the second axis of symmetry at right angles at their intersection, to overlap all the measurement points before the rotation and a judgment was made as to whether or not those differences corresponding to at least 95% of the total number of the calculated differences between the measured height values were within 20 nm.

Then, in the same manner as in Example 1, a back-surface antireflection layer, a light-shielding layer, and a front-surface antireflection layer were formed in this order as a light-shielding film (a thin film for transfer pattern formation) on each of the glass substrates of the substrate set, thereby manufacturing mask blanks.

Then, using two mask blanks thus obtained as a mask blank set, a set of DP photomasks corresponding to the DRAM hp22 nm generation were manufactured in the same manner as in Example 1. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 1. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 5

A plurality of glass substrates were obtained by carrying out a precision polishing process and an ultra-precision polishing process in the same manner as in Example 1. The flatness and symmetry of a main surface of each of the glass substrates thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in a 142 mm square area of the main surface and in chuck areas serving as portions to be chucked by an exposure apparatus, intersections of the grid were set as measurement points, and the height of the main surface from a reference plane was measured at the respective measurement points. Then, (2) a flatness in the 142 mm square area of the substrate was calculated from measured values and the substrate having a flatness greater than 0.3 μm was judged to be an unsuccessful product. Further, (3) differences each between the measured height values at both measurement points, which were in a relationship of being laterally equidistant from the first axis of symmetry in a direction perpendicular to the first axis of symmetry, in the 142 mm square area were calculated, differences each between the measured height values at both measurement points, which were in a relationship of being vertically equidistant from the second axis of symmetry in a direction perpendicular to the second axis of symmetry, in the 142 mm square area were calculated, and the substrate in which those differences corresponding to at least 95% of the total number of the calculated differences between the measured height values were greater than 20 nm was judged to be an unsuccessful product. Finally, (4) differences each between the measured height values at both measurement points, which were in a relationship of being laterally equidistant from the first axis of symmetry in the direction perpendicular to the first axis of symmetry, in the chuck areas were calculated, differences each between the measured height values at both measurement points, which were in a relationship of being vertically equidistant from the second axis of symmetry in the direction perpendicular to the second axis of symmetry, in the chuck areas were calculated, and a judgment was made as to whether or not those differences corresponding to at least 95% of the total number of the calculated differences between the measured height values were within 2 nm.

Then, in the same manner as in Example 1, a back-surface antireflection layer, a light-shielding layer, and a front-surface antireflection layer were formed in this order as a light-shielding film (a thin film for transfer pattern formation) on each of the glass substrates of the substrate set, thereby manufacturing mask blanks.

Then, using two mask blanks thus obtained as a mask blank set, a set of DP photomasks corresponding to the DRAM hp22 nm generation were manufactured in the same manner as in Example 1. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 1. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 6

With respect to mask blank substrates manufactured in Example 1, a MoSiON film (back-surface antireflection layer), a MoSi film (light-shielding layer), and a MoSiON film (antireflection layer) were formed as a light-shielding film (a thin film for transfer pattern formation) on each of the glass substrates. Specifically, using a target of Mo:Si=21:79 (at % ratio) and using Ar, $O_2$, $N_2$, and He (gas flow rate ratio Ar:$O_2$:$N_2$:He=5:4:49:42) at a sputtering gas pressure of 0.2 Pa, a film (MoSiON film) made of molybdenum, silicon, oxygen, and nitrogen was formed to a thickness of 7 nm by setting the power of the DC power supply to 3.0 kW. Then, using the same target and using Ar at a sputtering gas pressure of 0.1 Pa, a film (MoSi film: at % ratio of Mo and Si in the film was about 21:79) made of molybdenum and silicon was formed to a thickness of 30 nm by setting the power of the DC power supply to 2.0 kW. Then, using a target of Mo:Si=4:96 (at % ratio) and using Ar, $O_2$, $N_2$, and He (gas flow rate ratio Ar:$O_2$:$N_2$:He=6:5:11:16) at a sputtering gas pressure of 0.1 Pa, a film (MoSiON film) made of molybdenum, silicon, oxygen, and nitrogen was formed to a thickness of 15 nm by setting the power of the DC power supply to 3.0 kW. In this manner, mask blanks were manufactured. The total thickness of the light-shielding film was set to 52 nm. The back-surface antireflection layer, the light-shielding layer, and the front-surface antireflection layer formed under these conditions had low stress over the entire light-shielding film and thus it was possible to suppress the change in shape of the substrate to minimum.

Then, using two mask blanks thus obtained as a mask blank set, a set of DP photomasks corresponding to the DRAM hp32 nm generation were manufactured in the same manner as in Example 1. Each of the DP photomasks was inspected by a mask inspection apparatus and found to satisfy the conditions required for a DP photomask of the DRAM hp32 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp32 nm generation were manufactured in the same manner as in Example 1. Each of the DE photomasks was inspected by a mask inspection apparatus and found to satisfy the conditions required for a DE photomask of the DRAM hp32 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 7

With respect to mask blank substrates manufactured in Example 2, a light-shielding film comprising a back-surface antireflection layer, a light-shielding layer, and a front-surface antireflection layer, which had the same structures as those in Example 6, was formed on each of the glass substrates. Then, using two mask blanks thus obtained as a mask blank set, a set of DP photomasks corresponding to the DRAM hp32 nm generation were manufactured in the same manner as in Example 2. Each of the DP photomasks was inspected by a mask inspection apparatus and found to satisfy the conditions required for a DP photomask of the DRAM hp32 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp32 nm generation were manufactured in the same manner as in Example 2. Each of the DE photomasks was inspected by a mask inspection apparatus and found to satisfy the conditions required for a DE photomask of the DRAM hp32 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 8

With respect to mask blank substrates manufactured in Example 3, a light-shielding film comprising a back-surface antireflection layer, a light-shielding layer, and a front-surface antireflection layer, which had the same structures as those in Example 6, was formed on each of the glass substrates. Then, using two mask blanks thus obtained as a mask blank set, a set of DP photomasks corresponding to the DRAM hp22 nm generation were manufactured in the same manner as in Example 3. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 3. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 9

With respect to mask blank substrates manufactured in Example 4, a light-shielding film comprising a back-surface antireflection layer, a light-shielding layer, and a front-surface antireflection layer, which had the same structures as those in Example 6, was formed on each of the glass substrates. Then, using two mask blanks thus obtained as a mask blank set, a set of DP photomasks corresponding to the DRAM hp22 nm generation were manufactured in the same manner as in Example 4. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 4. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 10

With respect to mask blank substrates manufactured in Example 5, a light-shielding film comprising a back-surface antireflection layer, a light-shielding layer, and a front-surface antireflection layer, which had the same structures as those in Example 6, was formed on each of the glass substrates. Then, using two mask blanks thus obtained as a mask blank set, a set of DP photomasks corresponding to the DRAM hp22 nm generation were manufactured in the same manner as in Example 5. Each of the DP photomasks was inspected by a mask inspection apparatus and found to satisfy the conditions required for a DP photomask of the DRAM hp22 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, using two mask blanks manufactured in the same manner as described above as a mask blank set, a set of DE photomasks corresponding to the DRAM hp22 nm generation were manufactured in the same manner as in Example 5. Each of the DE photomasks was inspected by a mask inspection apparatus and found to satisfy the conditions required for a DE photomask of the DRAM hp22 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the light-shielding films of the mask blanks through predetermined processes, respectively, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 11

With respect to mask blank substrates manufactured in Example 1, a phase shift film and a light-shielding film comprising a back-surface antireflection layer, a light-shielding layer, and a front-surface antireflection layer were formed on each of the glass substrates. Specifically, using a mixed target of Mo and Si (at % ratio Mo:Si=10:90) as a sputtering target and using a mixed gas of Ar, $N_2$, and He (gas flow rate ratio Ar:$N_2$:He=5:49:46) as a sputtering gas, a MoSiN film was formed to a thickness of 69 nm as the phase shift film by setting the gas pressure to 0.3 Pa and the power of the DC power supply to 2.8 kW. Then, the substrates each formed with the phase shift film were heat-treated (annealed) at 250° C. for 5 minutes.

Then, the light-shielding film comprising the back-surface antireflection layer, the light-shielding layer, and the front-surface antireflection layer was formed. Specifically, first, using a Cr target as a sputtering target and using a mixed gas of Ar, $CO_2$, $N_2$, and He (gas flow rate ratio Ar:$CO_2$:$N_2$:He=22:39:6:33) as a sputtering gas, a CrOCN film was formed to a thickness of 30 nm as the back-surface antireflection layer by setting the gas pressure to 0.2 Pa and the power of the DC power supply to 1.7 kW. Then, using a Cr target as a sputtering target and using a mixed gas of Ar and $N_2$ (gas flow rate ratio Ar:$N_2$=83:17) as a sputtering gas, a CrN film was formed to a thickness of 4 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The back-surface antireflection layer, the light-shielding layer, and the front-surface antireflection layer formed under these conditions had low stress over the entire light-shielding film and the phase shift film also had low stress, and thus it was possible to suppress the change in shape of the substrate to minimum.

Then, two mask blanks thus obtained were used as a mask blank set and, using the DP technique, two transfer patterns in the form of two relatively coarse patterns divided from a single fine, high-density transfer pattern corresponding to the DRAM hp32 nm generation were formed in the phase shift films of the mask blanks through predetermined processes, respectively, and then a pattern of a light-shielding band was formed around the transfer pattern in each of the light-shielding films of the mask blanks through predetermined processes, thereby manufacturing a set of DP photomasks. Each of the DP photomasks was inspected by a mask inspection apparatus and found to satisfy the conditions required for a DP photomask of the DRAM hp32 nm generation. Further, using this DP photomask set, pattern transfer was carried out on a transfer target (resist films on a wafer, or the like) by the use of an exposure apparatus. Then, it was verified that there was no wiring short or disconnection in the transfer target otherwise caused by lack of overlay accuracy and thus the DP photomask set had high overlay accuracy.

Further, two mask blanks manufactured in the same manner as described above were used as a mask blank set and, using the DE technique, two transfer patterns in the form of two relatively coarse patterns divided from a single fine, high-density transfer pattern corresponding to the DRAM hp32 nm generation were formed in the phase shift films of the mask blanks through predetermined processes, respectively, and then a pattern of a light-shielding band was formed around the transfer pattern in each of the light-shielding films of the mask blanks through predetermined processes, thereby manufacturing a set of DE photomasks. Each of the DE photomasks was inspected by a mask inspection apparatus and found to satisfy the conditions required for a DE photomask of the DRAM hp32 nm generation. Further, using this DE photomask set, pattern transfer was carried out on a transfer target (a resist film on a wafer, or the like) by the use of an exposure apparatus. Then, it was verified that there was no wiring short or disconnection in the transfer target otherwise caused by lack of overlay accuracy and thus the DE photomask set had high overlay accuracy.

Further, with respect to two mask blanks manufactured in the same manner as described above, circuit patterns of a laminated structure of a semiconductor device corresponding to the DRAM hp45 nm generation were formed in the phase shift films of the mask blanks through predetermined processes, respectively, and then a pattern of a light-shielding band was formed around the transfer pattern in each of the light-shielding films of the mask blanks through predetermined processes, thereby manufacturing a set of photomasks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy.

EXAMPLE 12

A plurality of glass substrates ($SiO_2$—$TiO_2$ glass substrates) were obtained by carrying out a precision polishing process and an ultra-precision polishing process in the same manner as in Example 1. The flatness and symmetry of a main surface of each of the glass substrates thus obtained were examined with a wavelength-shift interferometer using a wavelength modulation laser. In order to examine the flatness and symmetry of the main surface, first, (1) a first axis of symmetry being parallel to and equidistant from left and right both end faces and a second axis of symmetry being parallel to and equidistant from left and right both end faces and a second axis of symmetry being parallel to and equidistant from upper and lower both end faces were respectively set on a main surface, on the side where a thin film for transfer pattern formation was to be provided, of a square substrate having been subjected to the predetermined polishing, a virtual grid was set at predetermined intervals with respect to the first axis of symmetry and the second axis of symmetry in an entire area where the height of the main surface was measurable, intersections of the grid were set as measurement points, and the height of the main surface from a reference plane was measured at the respective measurement points. Then, (2) differences each between measured height values at both measurement points, which were in a relationship of being laterally equidistant from the first axis of symmetry in a direction perpendicular to the first axis of symmetry, were calculated, differences each between the measured height values at both measurement points, which were in a relationship of being vertically equidistant from the second axis of symmetry in a direction perpendicular to the second axis of symmetry, were calculated, and a judgment was made as to whether or not those differences corresponding to at least 95% of the total number of the calculated differences between the measured height values were within 5 nm.

Then, a main surface, on the side opposite to the side where the thin film for transfer pattern formation was to be provided, of the glass substrate being a successful product was examined, thereby selecting a successful product in the same manner as in Example 1. On each of the main surfaces, on the side opposite to the side where the thin film for transfer pattern formation was to be provided, of the glass substrates thus obtained, a conductive back-side film made of CrN was formed. Then, a Mo film/Si film cycle multilayer reflective film being a multilayer reflective film suitable for EUV exposure light in an exposure light wavelength band of 13 to 14 nm was formed on each of the main surfaces on the side where the thin film for transfer pattern formation was to be provided. That is, using a Mo target and a Si target, the multilayer reflective film was formed by alternately laminating Mo films and Si films on the substrate by ion beam sputtering. A Si film was formed to 4.2 nm and a Mo film was formed to 2.8 nm and, given that this formed one cycle, Si films and Mo films were laminated by 40 cycles and then a Si film was formed to 4.2 nm. Then, as a protective film, a RuNb film was formed to 2.5 nm using a RuNb target. In this manner, multilayer reflective film coated substrates were manufactured.

Then, a buffer film was formed on the protective film of each of the multilayer reflective film coated substrates thus obtained. As the buffer film, a chromium nitride film was formed to a thickness of 20 nm. Using a Cr target and using a mixed gas of argon (Ar) and nitrogen ($N_2$) as a sputtering gas, the chromium nitride film was formed by DC magnetron sputtering. In the formed CrNx film, nitrogen (N) was set to 10 at % (x=0.1). Then, on this buffer film, a material containing Ta, B, and N was formed to a thickness of 80 nm as an absorber film. That is, using a target containing TaB and using argon (Ar) added with 10% nitrogen ($N_2$), the absorber film was formed by DC magnetron sputtering. In this manner, reflective mask blanks were obtained.

With respect to two reflective mask blanks thus obtained, circuit patterns of a laminated structure of a semiconductor device corresponding to the DRAM hp32 nm generation were formed in the absorber films of the mask blanks through predetermined processes, respectively, thereby manufacturing a set of reflective masks. Using this photomask set, the laminated structure was transferred to resist films on a wafer by the use of an exposure apparatus when forming the circuit patterns of the semiconductor device. Then, it was verified that there was no wiring short or disconnection between upper and lower layers otherwise caused by lack of overlay accuracy of the laminated structure and thus the photomask set had high overlay accuracy. That is, substrate deformation when the back side of each reflective mask was electrostatically chucked on a stage of an exposure apparatus was very small and, further, tendencies of such deformations were substantially the same between the substrates, and therefore, position offsets of the patterns of the absorber films were also very mall and tendencies thereof were also substantially the same so that the high overlay accuracy was realized.

As described above, according to this invention, it is possible to realize a mask blank substrate with high symmetry. As a consequence, it is possible to make better the flatness of a main surface thereof after chucking and thus to make very small the position offset caused by a photomask.

This invention is not limited to the above-mentioned embodiment and can be carried out by appropriately changing it. For example, the number of measurement points, the virtual grid intervals, the materials, the sizes, the processing sequences, and so on in the above-mentioned exemplary embodiment are only examples and this invention can be carried out by changing them in various ways within a range capable of exhibiting the effect of this invention. Other than that, this invention can be carried out with appropriate changes within a range not departing from the object of this invention.

This application is based upon and claims the benefit of priority from Japanese Patent Application No. 2008-301238, filed on Nov. 26, 2008, the disclosure of which is incorporated herein in its entirety by reference.

Description of Symbols
  1 mask blank substrate
  4 magnetic polishing slurry
  5 polishing spot
  6 electromagnet
  13 convex portion
  41 magnetic fluid
  42 polishing slurry

The invention claimed is:

1. A mask blank substrate having two main surfaces and four end faces, wherein a first axis of symmetry that passes through a central point set on the main surface and that is parallel to one of the end faces and a second axis of symmetry that passes through the central point and that is perpendicular to the first axis of symmetry are respectively set, and measurement points are set in the form of a grid with respect to the first axis of symmetry and the second axis of symmetry so as to measure heights of the main surface from a reference plane at the measurement points, respectively, and wherein differences each between measured height values at those measurement points located at positions that are axisymmetric with respect to the first axis of symmetry are calculated, and those differences corresponding to at least 95% of the total number of the calculated differences between the measured height values are within a predetermined value.

2. The mask blank substrate according to claim 1, wherein differences each between the measured height values at those measurement points located at the positions that are axisymmetric with respect to the second axis of symmetry are calculated and those differences corresponding to at least 95% of the number of the calculated differences between the measured height values are within the predetermined value.

3. The mask blank substrate according to claim 1, wherein the measurement points are set on the main surface on a side where a thin film for transfer pattern formation is to be provided.

4. The mask blank substrate according to claim 3, wherein a flatness in a 132 mm square area of the main surface on the side where the thin film for transfer pattern formation is to be provided is 0.3 μm or less and those differences corresponding to at least 95% of the total number of the calculated differences between the measured height values are within 10 nm.

5. The mask blank substrate according to claim 3, wherein a flatness in a 142 mm square area of the main surface on the side where the thin film for transfer pattern formation is to be provided is 0.3 μm or less and those differences corresponding to at least 95% of the total number of the calculated differences between the measured height values are within 20 nm.

6. The mask blank substrate according to claim 1, wherein those differences corresponding to at least 95% of the total number of the differences between the measured height values calculated in chuck areas of the main surface are within 2 nm, the chuck areas serving as areas that are suction-chucked when mounted in an exposure apparatus.

7. The mask blank substrate according to claim 1, wherein the measurement points are set on the main surface on a side opposite to a side where a thin film for transfer pattern formation is to be provided and those differences corresponding to at least 95% of the total number of the calculated differences between the measured height values are within 5 nm.

8. A mask blank, wherein a thin film for transfer pattern formation is formed on the main surface of the mask blank substrate according to claim 1.

9. A reflective mask blank, wherein a multilayer reflective film and the thin film for transfer pattern formation are formed on the main surface, on the side where the thin film for transfer pattern formation is to be provided, of the mask blank substrate according to claim 7 and a back-surface film is formed on the main surface on the side opposite to the side where the thin film for transfer pattern formation is to be provided.

10. A photomask, wherein a transfer pattern is formed in the thin film for transfer pattern formation of the mask blank according to claim 8.

11. A reflective mask, wherein a transfer pattern is formed in the thin film for transfer pattern formation of the reflective mask blank according to claim 9.

12. A mask blank substrate set comprising a plurality of mask blank substrates each being the mask blank substrate according to claim 1.

13. A mask blank set comprising a plurality of mask blanks each being the mask blank according to claim 8.

14. A photomask set comprising two photomasks each being the photomask according to claim 10, wherein two transfer patterns divided from a single transfer pattern by a double patterning/double exposure technique are separately formed in the thin films for transfer pattern formation of the two photomasks.

15. A method of manufacturing a semiconductor device, comprising a step of, using the photomask according to claim 10, exposing and transferring the transfer pattern of the photomask to a resist film on a wafer by a photolithography method.

16. A method of manufacturing a semiconductor device by, using the reflective mask according to claim 11, exposing and transferring the transfer pattern of the reflective mask to a resist film on a wafer by an EUV lithography method.

17. A method of manufacturing a semiconductor device, comprising a step of, using the photomask set according to claim 14, exposing and transferring the transfer patterns of the photomasks to a resist film on a wafer by a photolithography method.

18. A mask blank substrate having two main surfaces and four end faces, wherein a first axis of symmetry that passes through a central point set on the main surface and that is parallel to one of the end faces and a second axis of symmetry that passes through the central point and that is perpendicular to the first axis of symmetry are respectively set, and measurement points are set in the form of a grid with respect to the first axis of symmetry and the second axis of symmetry so as to measure heights of the main surface from a reference plane at the measurement points, respectively, and wherein differences each between measured height values at those measurement points located at positions that overlap each other when all the measurement points are rotated by 90 degrees about the central point as a rotation axis to cause all the measurement points before rotation and all the measurement points after the rotation to overlap each other are calculated, and those differences corresponding to at least 95% of the total number of the calculated differences between the measured height values are within a predetermined value.

19. The mask blank substrate according to claim 18, wherein the measurement points are set on the main surface on a side where a thin film for transfer pattern formation is to be provided.

20. The mask blank substrate according to claim 19, wherein a flatness in a 132 mm square area of the main surface on the side where the thin film for transfer pattern formation is to be provided is 0.3 μm or less and those differences corresponding to at least 95% of the total number of the calculated differences between the measured height values are within 10 nm.

21. The mask blank substrate according to claim 19, wherein a flatness in a 142 mm square area of the main surface on the side where the thin film for transfer pattern formation is to be provided is 0.3 μm or less and those differences corresponding to at least 95% of the total number of the calculated differences between the measured height values are within 20 nm.

22. The mask blank substrate according to claim 18, wherein those differences corresponding to at least 95% of the total number of the differences between the measured height values calculated in chuck areas of the main surface are within 2 nm, the chuck areas serving as areas that are suction-chucked when mounted in an exposure apparatus.

23. The mask blank substrate according to claim 18, wherein the measurement points are set on the main surface on a side opposite to a side where a thin film for transfer pattern formation is to be provided and those differences corresponding to at least 95% of the total number of the calculated differences between the measured height values are within 5 nm.

24. A mask blank, wherein a thin film for transfer pattern formation is formed on the main surface of the mask blank substrate according to claim 18.

25. A reflective mask blank, wherein a multilayer reflective film and the thin film for transfer pattern formation are formed on the main surface, on the side where the thin film for transfer pattern formation is to be provided, of the mask blank substrate according to claim 23 and a back-surface film is formed on the main surface on the side opposite to the side where the thin film for transfer pattern formation is to be provided.

26. A photomask, wherein a transfer pattern is formed in the thin film for transfer pattern formation of the mask blank according to claim 24.

27. A reflective mask, wherein a transfer pattern is formed in the thin film for transfer pattern formation of the reflective mask blank according to claim 25.

28. A mask blank substrate set comprising a plurality of mask blank substrates each being the mask blank substrate according to claim 18.

29. A mask blank set comprising a plurality of mask blanks each being the mask blank according to claim 24.

30. A photomask set comprising two photomasks each being the photomask according to claim 26, wherein two transfer patterns divided from a single transfer pattern by a double patterning/double exposure technique are separately formed in the thin films for transfer pattern formation of the two photomasks.

31. A method of manufacturing a semiconductor device, comprising a step of, using the photomask according to claim 26, exposing and transferring the transfer pattern of the photomask to a resist film on a wafer by a photolithography method.

32. A method of manufacturing a semiconductor device by, using the reflective mask according to claim 27, exposing and transferring the transfer pattern of the reflective mask to a resist film on a wafer by an EUV lithography method.

33. A method of manufacturing a semiconductor device, comprising a step of, using the photomask set according to claim 30, exposing and transferring the transfer patterns of the photomasks to a resist film on a wafer by a photolithography method.

* * * * *